(12) United States Patent
Takamiya

(10) Patent No.: US 6,511,790 B2
(45) Date of Patent: Jan. 28, 2003

(54) ALKALINE LIQUID DEVELOPER FOR LITHOGRAPHIC PRINTING PLATE AND METHOD FOR PREPARING LITHOGRAPHIC PRINTING PLATE

(75) Inventor: Shuichi Takamiya, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/934,520

(22) Filed: Aug. 23, 2001

(65) Prior Publication Data

US 2002/0055066 A1 May 9, 2002

(30) Foreign Application Priority Data

Aug. 25, 2000 (JP) .................................. 2000-255670
Sep. 29, 2000 (JP) .................................. 2000-297954

(51) Int. Cl.$^7$ ................................ G03F 7/30
(52) U.S. Cl. ...................... 430/302; 430/493
(58) Field of Search ................ 430/302, 493

(56) References Cited

U.S. PATENT DOCUMENTS

| | | | |
|---|---|---|---|
| 3,891,439 A | 6/1975 | Katz et al. | |
| 5,902,718 A | 5/1999 | Yamaguchi | |
| 6,261,740 B1 * | 7/2001 | Nguyen et al. | 430/271.1 |

FOREIGN PATENT DOCUMENTS

| EP | 0 992 854 A | 4/2000 |
|---|---|---|
| EP | 1 110 747 A | 6/2001 |

* cited by examiner

*Primary Examiner*—Hoa Van Le
(74) *Attorney, Agent, or Firm*—Burns, Doane, Swecker & Mathis, LLP

(57) ABSTRACT

An alkaline liquid developer suitable for development of an infrared radiation-presensitized plate for use in making a lithographic printing plate, which developer comprises at least one selected from the group consisting of amphoteric surfactants and cationic surfactants; a method for preparing a lithographic printing plate comprising the steps of image-wise light-exposing to infrared radiation, a presensitized plate for use in making a lithographic printing plate, said presensitized plate having an image-forming layer which comprises an IR-absorbing agent, and developing the light-exposed plate with an alkaline liquid developer comprising at least one selected from the group consisting of amphoteric surfactants and cationic surfactants. The alkaline liquid develper can provide a highly sharp and clear image in a lithographic printing plate without damages to the image areas, simultaneously exhibiting highly development performance to the non-image areas. The alkaline liquid developer of the present invention further inhibits occurrence of insoluble matter originated from a binder resin and/or an IR-absorbing agent, as well as adherence of the insoluble matter to the surface of a plate during processing, while retaining liquid conditions suitable for an alkaline liquid developer, and being capable of providing a stable processing procedure in an extended period.

3 Claims, No Drawings

ALKALINE LIQUID DEVELOPER FOR LITHOGRAPHIC PRINTING PLATE AND METHOD FOR PREPARING LITHOGRAPHIC PRINTING PLATE

BACKGROUND OF THE INVENTION

1. Field of the Invention

The present invention relates to a liquid developer suitable for alkaline development for processing a lithographic printing plate precursor, i.e., a presensitized plate for use in making a lithographic printing plate (hereinafter possibly referred to as "PS plate") which is directly imageable by scanning an infrared (IR) laser on the basis of digital signals through a computer, etc., i.e., a directly-imageable lithographic printing plate precursor. The present invention further relates to a method for preparing a lithographic printing plate wherein said liquid developer is used.

2. Description of the Prior Art

Recently, progress of technique on a laser has been remarkable, and particularly, a solid state laser or semiconductor laser having an emission range of from near infrared ray to infrared ray is very useful as a light exposure source in a system wherein a printing plate precursor is directly imaged by digital data, since such laser of high powered and compact type has been easily available.

As an image recording material suitable for laser-writing, for example, Japanese Patent Un-examined Publication (hereunder referred to as "J.P. KOKAI" ) No. Hei 7-285275 has suggested a positive-working image recording material comprising (a) a binder such as a cresol resin, (b) a compound which absorbs light so as to generate the heat, and (c) a compound such as quinonediazide which is heat-decomposable, whose pre-decomposition state being capable of substantially decreasing a solubility of said binder. The mechanism of this material is that on IR radiation, the light-exposed area becomes alkaline-soluble (i.e., heat-mode type), since the compound (b) generates the heat in the light-exposed area and then the compound (c) is decomposed. However, the generated heat is absorbed in some degree by a substrate aluminum plate and so the thermal efficiency of this mechanism is poor, and therefore the solubility of the light-exposed area to an alkaline liquid developer is not satisfactory in a development process. Consequently, alkaline strength of liquid developer must be raised to ensure the solubility of the light-exposed area.

On the other hand, in the lithographic printing plate precursor of heat-mode type, the resistance of non-heated areas (i.e., image areas) to dissolution in an alkaline liquid developer is poor under the above highly alkaline concentration, and when the image recording material has slightly scratches on the surface thereof, said scratched areas may be easily dissolved. Accordingly, there is a problem such that the image areas, particularly fine line areas and the like are easily impaired. This tendency is particularly serious in a positive-working lithographic printing plate precursor employing a polymeric compound which is highly soluble to an alkaline aqueous solution.

Consequently, the raise in alkaline strength of liquid developer should be limited, though said raise in alkaline strength is intended not to leave undissolved materials on non-image areas, and it is difficult to form a highly sharp and clear image without impairment to the formed image areas. There is therefore a need for improved sharpness and reproducibility of images, particularly fine images comprising a dot pattern, fine lines and the like.

Incidentally, in association with recent improvement on image recording materials of IR-laser exposure type, it tends to use an IR-absorbing agent in the image recording material, which absorber is more insoluble in an alkaline liquid developer than a conventional IR-absorbing dye such as o-quinonediazide. When such image recording material is processed in an alkaline liquid developer, insoluble matter originated from the IR-absorbing agent is discharged into the developer, and such insoluble matter may further interact with a component of binder polymers in the image recording material or inorganic substances in water to generate insoluble matter. The above insoluble matter may adhere to a plate during development procedure in making a printing plate so as to impair image areas of the plate. In addition, there is a large labor or cost for maintenance of processing tanks, since it is necessary to regularly remove the precipitated insoluble matter in the processing tanks.

DETAILED EXPLANATION OF THE INVENTION

Summary of the Invention

Accordingly, an object of the present invention is to provide an alkaline liquid developer for a lithographic printing plate, which developer can overcome the above conventional drawbacks, and form a highly sharp and clear image in a lithographic printing plate without damages to the formed image areas.

Another object of the present invention is to provide an alkaline liquid developer for a lithographic printing plate, which developer can prevent occurrence of insoluble matter originated from a binder resin and/or an IR-absorbing agent, as well as adherence of the insoluble matter to the surface of a plate during processing, while retaining liquid conditions suitable for an alkaline liquid developer, said developer being capable of providing a stable processing procedure in an extended period.

Another object of the present invention is to provide a method for preparing a lithographic printing plate which does not cause the formation of insoluble matter during development processing even when a large quantity of lithographic printing plate precursor are processed over a long time period and which allows stable treatment of a lithographic printing plate precursor.

Under such circumstances, the inventors of this invention have searched a compound which prevents the occurrence of insoluble matter and enhances the inhibition on dissolution of image areas in an alkaline liquid developer, while retaining liquid conditions suitable for an alkaline liquid developer such as a balance between a suitable alkaline concentration (hydroxide ion concentration) and $SiO_2$ concentration, and have found that the use of a specific surfactant in a liquid developer can prevent the occurrence of insoluble matter, adherence of said insoluble matter to the surface of a plate and deposit of said insoluble matter in processing tanks, and also can inhibit the dissolution of image areas on a plate to an alkaline aqueous solution. Thus the inventors have completed the present invention.

Consequently, the present invention is directed to an alkaline liquid developer suitable for development of an infrared radiation-presensitized plate for use in making a lithographic printing plate, which developer comprises at least one selected from the group consisting of amphoteric surfactants and cationic surfactants. The present invention is also directed to a method for preparing a lithographic printing plate comprising the steps of imagewise light-exposing to infrared radiation, a presensitized plate for use in making a lithographic printing plate, said presensitized plate having an image-forming layer which comprises an IR-absorbing agent, and then developing the light-exposed plate with an alkaline liquid developer comprising at least one selected from the group consisting of amphoteric surfactants and cationic surfactants.
Description of the Preferred Embodiments The present invention will be described in more detail below.

An alkaline liquid developer and a method for preparing a lithographic printing plate according to the present invention can be applied to a processing procedure of all kinds of a presensitized plate for use in making a lithographic printing plate, said presensitized plate having an image-forming layer which comprises an IR-absorbing agents.

The alkaline liquid developer (hereinafter possibly referred to as simply "developer") according to the present invention is fundamentally an alkaline aqueous solution, and the composition of said alkaline aqueous solution can be selected from conventional ones.

The alkaline aqueous solution includes an alkaline aqueous solution comprising an alkaline silicate or a nonreducing sugar, and a base, said solution's pH being preferably from 12.5 to 14.0. The alkaline silicate may be those exhibiting an alkalinity when dissolved in water, and examples thereof include an alkali metal silicate such as sodium silicate, potassium silicate and lithium silicate, and ammonium silicate. Said alkaline silicate may be used alone, or in combination.

The development performance of the alkaline aqueous solution may be easily modulated by adjusting a molar ratio of silicon oxide ($SiO_2$) and an alkali oxide ($M_2O$, wherein M represents an alkali metal or an ammonium group) which are components of the alkaline silicate, and concentrations thereof.

The alkaline aqueous solution has preferably the molar ratio between silicon oxide ($SiO_2$) and an alkali oxide ($M_2O$) ($SiO_2/M_2O$: molar ratio) of from 0.5 to 3.0, and more preferably from 1.0 to 2.0. When the molar ratio, $SiO_2/M_2O$ is less than 0.5, alkalinity of the solution strengthens so as to cause a harmful effect such as etching of an aluminum plate which is generally used as a substrate in a lithographic printing plate precursor. When the molar ratio, $SiO_2/M_2O$ is more than 3.0, the development performance of the solution may be degraded.

The concentration of alkaline silicate in the developer ranges generally from 1 to 10% by weight, preferably from 3 to 8% by weight, and more preferably from 4 to 7% by weight. When said concentration is less than 1% by weight, the development performance or treatment capacity may be degraded. When said concentration is more than 10% by weight, precipitated materials or crystals may be easily generated, and gelation may be easily caused during neutralization of waste liquid, resulting in an obstacle to the waste disposal.

In the developer based on an alkaline aqueous solution comprising a nonreducing sugar and a base, the nonreducing sugar denotes sugars having no reductive property due to the absence of a free aldehyde group or a free ketone group. Said nonreducing sugar is classified into trehalose-type oligosaccharides wherein a reductive group and another reductive group make a linkage; glycosides wherein a reductive group in a sugar is linked to a non-sugar compound; and sugar alcohols which are produced by reducing a sugar with hydrogenation.

Said trehalose-type oligosaccharides include sucrose and trehalose, and said glycosides include alkyl glycosides, phenol glycosides, mustard oil glycosides and the like.

Said sugar alcohols include D,L-arabitol, ribitol, xylitol, D,L-sorbitol, D,L-mannitol, D,L-iditol, talitol, dulcitol, allodulcitol and the like.

Further, maltitol obtained by hydrogenation of disaccharide, a reduced material obtained by hydrogenation of oligosaccharide (a reduced starch syrup) and the like are preferably used.

In the above nonreducing sugar, preferred are sugar alcohols and sucrose, and particularly preferred are D-sorbitol, sucrose and a reduced starch syrup, since they have buffering action in appropriate pH range.

The above nonreducing sugar may be used alone or in combination, and the concentration thereof in the developer ranges generally from 0.1 to 30% by weight, and preferably from 1 to 20% by weight.

In the developer, an alkaline agent may be used as a base in combination with the above mentioned alkaline silicate or nonreducing sugar, and said alkaline agent may be selected from those well known.

The alkaline agent includes inorganic alkaline agents such as sodium hydroxide, potassium hydroxide, lithium hydroxide, sodium tertiary phosphate, potassium tertiary phosphate, ammonium tertiary phosphate, sodium secondary phosphate, ammonium secondary phosphate, sodium carbonate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

The alkaline agent also includes organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like.

Among these alkaline agents, preferred are sodium hydroxide and potassium hydroxide, since the amount of them with respect to the nonreducing sugar can be varied to allow pH adjustment in broad range of pH. Further, sodium tertiary phosphate, potassium tertiary phosphate, sodium carbonate and potassium carbonate are also preferable, since they have themselves, buffering action.

The above alkaline agent may be used alone or in combination.

The alkaline liquid developer according to the present invention comprises at least one selected from the group consisting of amphoteric surfactants and cationic surfactants in the above mentioned alkaline aqueous solution.

The amphoteric surfactant used in the developer according to the present invention may be specifically selected from the group consisting of the compounds represented by the following formula (I) or (II), and a salt thereof.

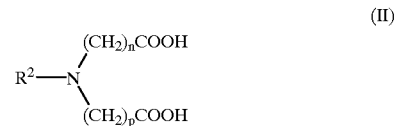

wherein $R^1$ and $R^2$ independently represent a hydrocarbon group having carbon atoms of 4 to 30, and m, n and p independently represent an integer of from 1 to 10.

The salt of the compound represented by the following formula (I) or (II) includes alkaline metal salts such as sodium salt, potassium salt and lithium salt, ammonium salt, and amine salt. The hydrocarbon group represented by $R^1$ and $R^2$ may be preferably an aliphatic group, which may be a linear or branched chain, and may be saturated or unsaturated. In the formula (II), n and p are normally identical.

The above compound and a salt thereof may be prepared by means of a conventional method. The above compound and the salt thereof may be commercially available, and it is known as a market product, for example, a trade name Paionin C-158-G manufactured by Takemoto Yushi Inc.

The above compound and the salt thereof may be used alone or in combination and the amount thereof in the alkaline liquid developer ranges generally from 0.001 to 10% by weight, preferably from 0.005 to 1% by weight, and most preferably from 0.01 to 0.5% by weight. When the amount is less than 0.001% by weight, the occurrence of insoluble matter is not sufficiently prevented, and when the amount is more than 10% by weight, the development performance of the developer possibly degrades.

The cationic surfactant used in the developer according to the present invention includes amine salts, quaternary ammonium salts, phosphonium salts, sulfonium salts and the like.

Examples of the amine salts are primary amine salts represented by for example, the following formula (1), secondary amine salts represented by for example, the following formula (2), tertiary amine salts represented by for example, the following formula (3), modified amine salts represented by for example, the following formulas (4) to (6), and imidazoline-amine salts represented by for example, the following formula (7).

Examples of the quaternary ammonium salts include tetraalkyl quaternary ammonium salts represented by for example, the following formula (8), modified trialkyl quaternary ammonium salts represented by for example, the following formulas (9) to (11), trialkyl benzyl quaternary ammonium salts represented by for example, the following formula (12), modified trialkyl benzyl quaternary ammonium salts represented by for example, the following formulas (13) to (15), alkyl pyridinium salts represented by for example, the following formula (16), modified alkyl pyridinium salts represented by for example, the following formulas (17) to (19), alkyl quinolinium salts represented by for example, the following formula (20), imidazolinium salts represented by for example, the following formula (21) and benzimidazolinium salts represented by for example, the following formula (22).

Examples of the phosphonium salts include alkyl phosphonium salts represented by for example, the following formula (23).

Examples of the sulfonium salts include alkyl sulfonium salts represented by for example, the following formula (24).

Counter anions of the above compounds are for example, various acid radical ions, an acid ester ion such as R—O—$SO_3^-$, halogen ions, hydroxide ion ($OH^-$), etc.

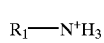

(1)

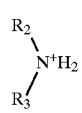

(2)

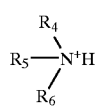

(3)

-continued

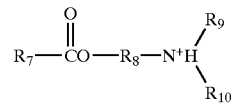

(4)

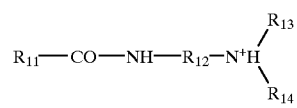

(5)

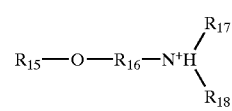

(6)

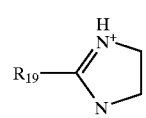

(7)

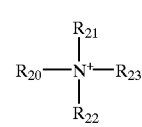

(8)

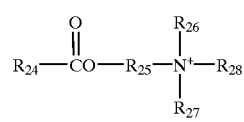

(9)

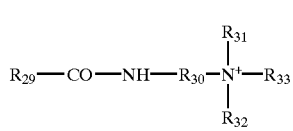

(10)

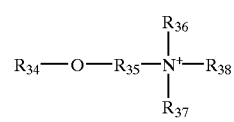

(11)

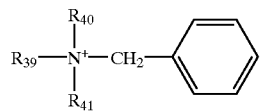

(12)

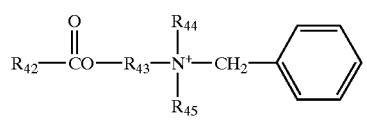

(13)

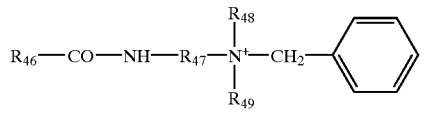

(14)

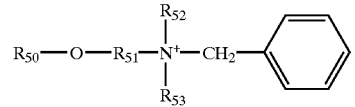

(15)

(16)

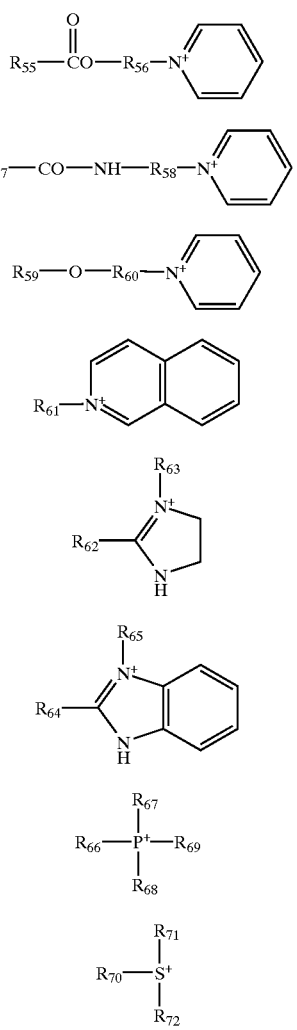

In the above formulas (1) to (24), $R_1$, $R_2$, $R_3$, $R_4$, $R_5$, $R_6$, $R_7$, $R_9$, $R_{10}$, $R_{11}$, $R_{13}$, $R_{14}$, $R_{15}$, $R_{17}$, $R_{18}$, $R_{19}$, $R_{20}$, $R_{21}$, $R_{22}$, $R_{23}$, $R_{24}$, $R_{26}$, $R_{27}$, $R_{28}$, $R_{29}$, $R_{31}$, $R_{32}$, $R_{33}$, $R_{34}$, $R_{36}$, $R_{37}$, $R_{38}$, $R_{39}$, $R_{40}$, $R_{41}$, $R_{42}$, $R_{44}$, $R_{45}$, $R_{46}$, $R_{48}$, $R_{49}$, $R_{50}$, $R_{52}$, $R_{53}$, $R_{54}$, $R_{55}$, $R_{57}$, $R_{59}$, $R_{61}$, $R_{62}$, $R_{63}$, $R_{64}$, $R_{65}$, $R_{66}$, $R_{67}$, $R_{68}$, $R_{69}$, $R_{70}$, $R_{71}$ and $R_{72}$ each independently represents an optionally substituted, saturated or unsaturated hydrocarbon monovalent group having from 1 to 18 carbon atoms. The monovalent hydrocarbon group may be a chain or cyclic form. The saturated or unsaturated hydrocarbon monovalent group includes an alkyl group, a cycloalkyl group, an alkenyl group, a cycloalkenyl group, an aryl group, an aralkyl group, a phenyl group, a benzyl group and the like. The substituent includes halogen, hydroxyl group and the like.

In the above formulas, $R_8$, $R_{12}$, $R_{16}$, $R_{25}$, $R_{30}$, $R_{35}$, $R_{43}$, $R_{47}$, $R_{51}$, $R_{56}$, $R_{58}$ and $R_{60}$ each independently represents a single bond or an optionally substituted, saturated or unsaturated hydrocarbon bivalent group having from 1 to 18 carbon atoms. The bivalent hydrocarbon group may be a chain or cyclic form. The hydrocarbon bivalent group includes an alkylene group, a cycloalkylene group, an alkenylene group, cycloalkenylene group, an arylene group, an aralkylene group and the like. The substituent includes halogen, hydroxyl group and the like.

The above cationic surfactant may be commercially available. Examples of the marketing product thereof are triethyl benzyl ammonium chloride manufactured by Tokyo Kasei, Nippon Fine Chemical, etc., tetramethyl ammonium chloride manufactured by Tokyo Kasei, etc., triethyl benzyl ammonium bromide manufactured by Nippon Fine Chemical, etc, trioctyl methyl ammonium chloride manufactured by Koei Kagaku, etc., tributyl benzyl ammonium chloride manufactured by Koei Kagaku, etc., trimethyl benzyl ammonium chloride manufactured by Nippon Fine Chemical, etc., N-lauryl pyridinium chloride manufactured by Koei Kagaku, etc., tetra-n-butyl ammonium hydroxide manufactured by Nippon Fine Chemical, etc., trimethyl benzyl ammonium hydroxide manufactured by Nippon Fine Chemical, etc., tetramethyl ammonium bromide manufactured by Nippon Fine Chemical, etc., tetraethyl ammonium bromide manufactured by Nippon Fine Chemical, etc., tetra-n-butyl ammonium bromide manufactured by Nippon Fine Chemical, etc., and the like.

The molecular weight of the above cationic surfactant ranges preferably from 50 to 10,000, and more preferably from 100 to 5,000, and most preferably from 500 to 3,500. When the molecular weight thereof is less than 50, the inhibitive power against the solubility of image areas is not obtained sufficiently, and when the molecular weight thereof is more than 10,000, the development performance to the non-image areas will be degraded.

The above cationic surfactant may be used alone or in combination and the amount thereof in the alkaline liquid developer ranges generally from 0.001 to 10% by weight, preferably from 0.05 to 5% by weight, and most preferably from 0.1 to 3% by weight. When the amount is less than 0.001% by weight, the solubility of image areas formed is not sufficiently inhibited, and when the amount is more than 10% by weight, the inhibitive power against the solubility of image areas becomes excessive and the development sensitivity is possibly degraded.

The use of the above amphoteric surfactant and/or cationic surfactant in an alkaline liquid developer is capable of forming an edge-form, highly shrap and clear image without impairment to the formed image areas caused by dissolving the image, even if a highly alkali-soluble high molecular weight compound is used in an image-forming layer or alkaline concentration of the developer is raised. Thus the use of the above surfactant in an alkaline liquid developer is capable of sharply reproducing fine images including dot patterns, fine lines and the like.

The above surfactant also adsorbs the deposited insoluble matter which is caused by a binder resin and/or an IR-absorbing agent in an alkaline developer, and then the compound exhibits surface activity to increase the dispersion properties of the insoluble matter, and the surfactant ultimately prevents the insoluble matter from adhering to a plate and/or depositing in a processing tank.

The above surfactant per se exhibits an excellent surface activity, and the solubility thereof in an alkaline developer is favorable. Additionally, the above surfactant prevents effective components in an alkaline liquid developer from depositing in the developer so as to increase the solubility of effective components in the alkaline liquid developer. Accordingly, the use of the above surfactant also advantageously contribute to a highly concentrated developer. The realization of highly concentrated developer will exhibit improvement of preservation and carrier efficiency of the developer, reduction of a volume of replenisher-tank, etc., and therefore such realization can exhibit efficacy on a handling quality of the developer and reduction of devices. In addition, the use of the above surfactant inhibits in an extended period, adherence of insoluble matter to a plate or a processing tank and deposition of effective components in a processing device in which the processing procedure is repeatedly performed, without affecting properties which reside in the developer, and without a necessity of adjusting a component balance such as the molar ratio of $SiO_2/M_2O$ and pH, so as to allow a stable processing procedure.

The alkaline liquid developer according to the present invention is a developer comprising an alkaline silicate or a nonreducing sugar, and a base. As the cationic component thereof, $Li^+$, $Na^+$, $K^+$ and $NH_4^+$ are conventionally used. In particular, a developer system comprising lot of a cation which has a small ionic radius is highly penetrative to an image-forming layer, such system being excellent in development performance, however, the system also dissolve the image area to impair the image. Accordingly, the increase of alkaline concentration should be limited to a certain extent, and it is in need of setting of subtle liquid condition in order that simultaneously impairment of the image and the image-forming layer which is left on non-image areas (undissolved, left materials) may not be generated.

However, the use of cation which has relatively large ionic radius in a developer inhibits the penetration of developer into an image-forming layer, and so it is possible to improve an inhibitive power against the solubility of image areas without decrease of alkaline concentration, i.e., without decrease of the development performance.

As the cationic component, other cations than alkaline metal cations and ammonium cation may be used.

The alkaline developer according to the present invention may comprise the following additives so as to enhance the performance of developing: for example, neutral salts such as NaCl, KCl and KBr disclosed in J.P. KOKAI No. Sho 58-75152, chelating agents such as EDTA, NTA and the like disclosed in J.P. KOKAI No. Sho 58-190952, complex compounds such as $[Co(NH_3)_6]Cl_3$ and $CoCl_2 \cdot 6H_2O$ disclosed in J.P. KOKAI No. Sho 59-121336, anion or amphoteric surfactants such as sodium alkyl naphthalene sulfonate, N-tetradecyl-N,N-dihydroxyethyl betaine and the like disclosed in J.P. KOKAI No. Sho 50-51324, nonionic surfactants such as tetramethyl decynediol disclosed in U.S. Pat. No. 4,374,920, cationic polymers such as quaternary methyl chloride of p-dimethylamino methyl polystyrene disclosed in J.P. KOKAI No. Sho 55-95946, amphoteric polymeric electrolyte such as a copolymer of vinylbenzyl trimethylammonium chloride and sodium acrylate disclosed in J.P. KOKAI No. Sho 56-142528, reducing inorganic salts such as sodium sulfite disclosed in J.P. KOKAI No. Sho 57-192951, inorganic lithium salts such as lithium chloride disclosed in J.P. KOKAI No. Sho 58-59444, organic metal surfactant comprising organic Si, Ti and the like disclosed in J.P. KOKAI No. Sho 59-75255, organic boron compounds disclosed in J.P. KOKAI No. Sho 59-84241, quaternary ammonium salts such as tetraalkyl ammonium oxide disclosed in EP 101010, and the like.

The method for preparing a lithographic printing plate wherein the alkaline developer according to the present invention is used is explained below.

The method for preparing a lithographic printing plate according to the present invention comprises a step of imagewise exposing to infrared radiation, a presensitized plate for use in making a lithographic printing plate, said presensitized plate (PS plate) having at least an image-forming layer which comprises an IR-absorbing agent, and a step of developing the light-exposed plate with the alkaline liquid developer comprising at least one selected from the group consisting of amphoteric surfactants and cationic surfactants.

PS plate having at least an image-forming layer comprising an IR-absorbing agent is desirably-imagewise exposed to the light for example, by means of infrared radiation laser based on digital signals, and so the IR-absorbing agent in the image-forming layer efficiently absorbs the laser light so as to convert the laser light into the heat to form a image through the following mechanism.

Namely, in case of a positive-working lithographic printing plate precursor, merely the light-exposed area of the image-forming layer generates the heat through accumulation of absorbed energy by light exposure so as to become alkaline-soluble. The alkaline developer removes merely the light-exposed area so as to form the desirable image. In case of a negative-working lithographic printing plate precursor, the light-exposed area of the image-forming layer generates the heat through accumulation of absorbed energy by light exposure so as to generate an acid, and said acid makes a coexistent crosslinking-agent start a crosslinking reaction, and so merely the light-exposed area becomes alkaline-nonsoluble to form an image. On the other hand, the non-exposed area is removed by an alkaline developer so as to form a desirable image.

In the method for preparing lithographic printing plate according to the present invention, the alkaline liquid developer comprising the above surfactant is used as an alkaline developer in the above process.

For example, in developing process of a positive-working PS plate, merely the light-exposed area of the image-forming layer generates the heat through accumulation of absorbed energy by light exposure so as to become alkaline-soluble. When a strong alkaline developer is used, it is problem that marginal parts of image areas which are close to the light-exposed area, or slightly scratched parts of image area may be possibly removed together with the non-image area (non-exposed area) through the alkaline developer, since the image-forming layer of heat-mode type PS plate is poor in resistance to dissolution in an alkaline developer as above-mentioned. The use of the above surfactant in an alkaline developer can control the development performance of alkaline developer in well-balance to prevent undesirable dissolution of micro image areas such as fine lines and dot patterns, and therefore the reproducibility of fine images are improved. Accordingly, the alkaline liquid developer of the present invention is particularly useful for use in processing a positive-working lithographic printing plate precursor.

The manner of use on the alkaline liquid developer according to the present invention is not specifically limited. Recently, in order to realize rationalization and standardization of plate making procedure in the field of plate-making and printing industries, automatic processors for printing plate have been widely used. The alkaline liquid developer according to the present invention may be used in the automatic processor.

The above automatic processor commonly comprises a developing zone and a post-treating zone, and also comprises a device for transporting PS plates, a tank for processing solutions, and a spray device, wherein a light-exposed plate is carried horizontally, and processed by spraying each processing solution from a nozzle which solution is pumped up. Recently, it has also been known a method wherein a PS plate is conveyed and immersed in a processing tank filled up with a processing solution through the action of dipped guide roll to thus develop the plate. In these automatic treatments, the treatment may be performed while supplementing a replenisher to each processing tank, in proportion to the quantity of PS plates processed and the running time of the processor.

In this case, an aqueous solution which has the higher alkalinity than the developer can be used as a replenisher into the developer so as to treat a large amount of PS plate over an extended period without a replacement of developer in a processing tank. Since the alkaline liquid developer of the present invention facilitates a highly concentrated composition, it is a preferable embodiment to employ the above supplementary manner.

In other words, the alkaline liquid developer of the present invention may be used as a replenisher, which has a higher alkalinity and a higher concentration with respect of ingredients than those of a developer.

The above alkaline liquid developer and replenisher may comprise possibly, various surfactants other than the above-mentioned surfactants, organic solvents and the like in order to enhance or repress development performance, and enhance dispersion of insoluble matter during development procedure and an ink-affinity of image areas on a plate. Such surfactant may be selected from anionic, cationic, nonionic and amphoteric surfactants, and such organic solvent includes benzyl alcohol and the like. To the above alkaline liquid developer and replenisher, polyethylene glycol and/or the derivatives thereof, or polypropylene glycol and/or derivative thereof may be also added.

Further, as occasion demands, there may be added to the developer or replenisher, hydroquinone, resorcin, inorganic salt reductants such as sodium or potassium salt of sulfurous acid or bisulfurous acid, organic carboxylic acid, antifoaming agents and water softners.

The lithographic printing plate obtained by processing a PS plate with the alkaline liquid developer and optionally a replenisher according to the present invention may be further subjected to post-treatments with any of washing-water, a rinsing solution which commonly comprises a surfactant and a desensitizing gum solution which comprises for instance, gum arabic and starch derivatives. The plates can be subjected to any combination of these post-treatments.

The PS plate can be processed by a so-called throwaway-processing system in which the PS plate is processed with a substantially flesh processing solution.

Then, the lithographic printing plate precursor to which the alkali liquid developer according to the present invention can be applied will hereunder be described in detail.

The lithographic printing plate precursor comprises a substrate, an image-forming layer applied onto the substrate and further an optional other layer. The image-forming layer comprises (A) an IR-absorbing agent as well as at least (B) an alkali-soluble high molecular weight compound, and optionally (C) a compound, which may be compatible with the alkali-soluble high molecular weight compound to thus reduce the solubility of the alkali-soluble high molecular weight compound in an alkaline liquid developer and whose effect of reducing the solubility of the polymeric compound is lowered through heating and (D) a cyclic acid anhydride. Moreover, in case of a negative-working lithographic printing plate precursor, the light-exposed area is cured to give an image area and therefore, the image-forming layer further comprises (E) a compound capable of generating an acid through heating and (F) a crosslinking agent capable of causing crosslinking by the action of an acid. Each ingredient of the lithographic printing plate precursor will briefly be described below.

(A) IR-Absorbing Agent

The IR-absorbing agent (hereunder also referred to as "component (A)") serves to convert infrared rays absorbed into heat.

As IR-absorbing agents, which may be used in the present invention, there may be listed, for instance, dyes or pigments capable of absorbing, at a high rate, infrared rays having a wavelength of not less than 700 nm and preferably infrared rays falling within the range of from 750 to 1200 nm, with dyes or pigments having an absorption peak falling within the range of from 760 to 1200 nm being more preferred.

The foregoing dye materials may be commercially available ones or those known in the literature (see, for instance, "SENRYO BINRAN", edited by YUKI GOSEI KAGAKU KYOKAI, Published in Showa 45 (1970)) and specific examples thereof are azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes and metal thiolate complexes.

Among them, preferably used herein include, for instance, cyanine dyes such as those disclosed in, for instance, Japanese Un-Examined Patent Publication Nos. Sho 58-125246, Sho 59-84356, Sho 59-202829 and Sho 60-78787; methine dyes such as those disclosed in, for instance, Japanese Un-Examined Patent Publication Nos. Sho 58-173696, Sho 58-181690 and Sho 58-194595; naphthoquinone dyes such as those disclosed in, for instance, Japanese Un-Examined Patent Publication Nos. Sho 58-112793, Sho 58-224793, Sho 59-48187, Sho 59-73996, Sho 60-52940 and Sho 60-63744; squarylium dyes such as those described in, for instance, Japanese Un-Examined Patent Publication No. Sho 58-112792; cyanine dyes such as those disclosed in, for instance, G.B. Patent No. 434,875; and dihydropyrimidine squarylium dyes such as those described in, for instance, U.S. Pat. No. 5,380,635.

Preferably used herein also include, for instance, sensitizing agents capable of absorbing near infrared rays disclosed in U.S. Pat. No. 5,156,938; substituted arylbenzo (thio) pyrylium salts disclosed in U.S. Pat. No. 3,881,924; trimethine thiopyrylium salts disclosed in Japanese Un-Examined Patent Publication No. Sho 57-142645 (U.S. Pat. No. 4,327,169); pyrylium compounds disclosed in Japanese Un-Examined Patent Publication Nos. Sho 58-181051, Sho 58-220143, Sho 59-41363, Sho 59-84248, Sho 59-84249, Sho 59-146063 and 59-146061; cyanine dyes disclosed in Japanese Un-Examined Patent Publication No. Sho 59-216146; pentamethine thiopyrium salts disclosed in U.S. Pat. No. 4,283,475; pyrilium compounds disclosed in Japanese Examined Patent Publication Nos. Hei 5-13514 and Hei 5-19702; and commercially available ones such as Epolight III-178, Epolight III-130, Epolight III-125 and Epolight IV-62A (available from Epoline Company).

Preferably used herein also include near infrared ray-absorbing dyes such as those represented by the general formulas (I) and (II) disclosed in U.S. Pat. No. 4,756,993.

Among these, more preferably used herein are cyanine dyes, squarylium dyes, pyrylium dyes and nickel thiolate complexes.

As the foregoing pigments, there may be listed, for instance, commercially available pigments or those disclosed in, for instance, Color Index (C.I.) BINRAN ("SAISHIN GANRYO BINRAN", edited by NIPPON GANRYO GIJUTSU KYOKAI, 1977), "SAISHIN GANRYO OYO GIJUTSU", CMC Publishing Company, 1986, "INSATSU INKU GIJUTSU", CMC Publishing Company, 1984 and examples thereof are black pigments, yellow pigments, orange pigments, brown pigments, red pigments, purple pigments, blue pigments, green pigments, fluorescent pigments, powdery metal pigments and other polymer-bonded dyes.

Specific examples thereof include insoluble azo pigments, azo lake pigments, condensed azo pigments, chelate azo pigments, phthalocyanine pigments, anthraquinone pigments, perillen and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments and carbon black.

Among them, preferred is carbon black.

The foregoing pigments may be used after subjecting them to surface treatments or without any surface treatment.

Such surface treatments may be, for instance, a method comprising coating the surface thereof with a resin or a wax, a method comprising adhering a surfactant to the surface of these pigments, and a method comprising bonding a reactive substance (such as a silane-coupling agent, an epoxy compound or polyisocyanate) to the surface of these pigments. These surface treating methods are disclosed in "Characteristic Properties and Applications of Metal soaps", SAIWAI Publishing Company, "SAISHIN GANRYO OYO GIJUTSU", CMC Publishing Company, 1986 and "INSATSU INKU GIJUTSU", CMC Publishing Company, 1984.

The particle size of the foregoing pigments preferably ranges from 0.01 to 10 $\mu$m, more preferably 0.05 to 1 $\mu$m and most preferably 0.1 to 1 $\mu$m.

This is because if the particle size is less than 0.01 $\mu$m, the dispersed substances present in prepared dispersions such as a coating liquid for forming a light-sensitive layer sometimes have deteriorated stability, while if it exceeds 10 $\mu$m, the uniformity of the resulting image-forming layer is often impaired.

Methods for dispersing a pigment in a medium may appropriately be selected from known dispersion techniques such as those, which make use of, for instance, a dispersing device widely used in, for instance, ink-manufacturing and toner-manufacturing techniques.

The foregoing dispersing devices may be, for instance, ultrasonic dispersing devices, sand mills, attritors, pearl mills, super mills, ball mills, impellers, dispersers, KD mills, colloid mills, dynatrons, three roll mills and pressurized kneaders. These devices are detailed in, for instance, "SAISHIN GANRYO OYO GIJUTSU", CMC Publishng Company, 1986.

The content of the foregoing dye or pigment preferably ranges from 0.01 to 50% by weight, more preferably 0.1 to 10% by weight and most preferably 0.5 to 10% by weight for dyes and 3.1 to 10% by weight for pigments, on the basis of the total solid content (by weight) of the image-forming layer.

If the content of the dye or pigment is less than 0.01% by weight, the resulting image-forming layer has a reduced sensitivity, while if it exceeds 50% by weight, the uniformity of the resulting image-forming layer is sometimes impaired and the durability thereof is often deteriorated.

The foregoing dye or pigment may be added to the same layer together with other components or may be added to a separate layer. When it is added to a separate layer, it is preferred to add the same to a layer adjacent to the component (C)—containing layer as will be detailed later. In addition, the dye or pigment is preferably incorporated into the layer containing the alkali-soluble high molecular weight compound, but these components may be added to separate layers.

(B) Alkali-soluble High Molecular Weight Compound

As the alkali-soluble high molecular weight compounds (hereunder also referred to as "component (B)") usable in the present invention, there may be listed, for instance, high molecular weight compounds soluble in an alkali aqueous solution and having the following acidic groups (1) to (3) in their main chains and/or side chains:

(1) phenolic group (—Ar—OH)
(2) sulfonamide group (—SO$_2$NH—R)
(3) substituted sulfonamide type acidic group (hereunder referred to as "active imide group") [—SO$_2$NHCOR, —SO$_2$NHSO$_2$R, —CONHSO$_2$R].

In the foregoing acidic groups (1) to (3), Ar represents a substituted or unsubstituted divalent aryl coupling group and R represents a substituted or unsubstituted hydrocarbon group.

Specific examples of alkali-soluble high molecular weight compounds will be listed below, but the present invention is not restricted to these specific ones at all.

(1) Examples of alkali-soluble high molecular weight compounds carrying phenolic groups are novolak resins such as polycondensates of phenol with formaldehyde, polycondensates of m-cresol with formaldehyde, polycondensates of p-cresol with formaldehyde, polycondensates of m-/p-mixed cresol with formaldehyde and polycondensates of phenol, cresol (which may be m-, p- or m-/p-mixed cresol) and formaldehyde; or polycondensates of pyrogallol with acetone. In addition, high molecular weight compounds obtained by polymerizing monomers having phenol groups on the side chains may likewise be listed as examples.

Examples of high molecular weight compounds carrying phenolic hydroxyl groups on the side chains are those obtained by bomopolymerizing polymerizable monomers consisting of low molecular weight compounds each having at least one phenolic hydroxyl group and at least one polymerizable unsaturated bond or copolymerizing such polymerizable monomers with other polymerizable monomers.

Examples of such monomers carrying phenol groups are acrylamides, methacryl amides, acrylic acid esters, methacrylic acid esters or hydroxystyrenes, which have phenol groups on the side chains.

Specific examples thereof preferably include N-(2-hydroxyphenyl) acrylamide, N-(3-hydroxyphenyl) acrylamide, N-(4-hydroxyphenyl) acrylamide, N-(2-hydroxy-phenyl) methacrylamide, N-(3-hydroxyphenyl) methacrylamide, N-(4-hydroxyphenyl) methacrylamide, o-hydroxyphenyl acrylate, m-hydroxyphenyl acrylate, p-hydroxy-phenyl acrylate, o-hydroxyphenyl methacrylate, m-hydroxyphenyl methacrylate, p-hydroxyphenyl methacrylate, o-hydroxystyrene, m-hydroxystyrene, p-hydroxy-styrene, 2-(2-hydroxyphenyl) ethyl acrylate, 2-(3-hydroxyphenyl) ethyl acrylate, 2-(4-hydroxyphenyl) ethyl acrylate, 2-(2-hydroxyphenyl) ethyl methacrylate, 2-(3-hydroxyphenyl) ethyl methacrylate and 2-(4-hydroxyphenyl) ethyl methacrylate.

The foregoing alkali-soluble high molecular weight compound carrying a phenolic group preferably has a weight-average molecular weight ranging from $5.0 \times 10^2$ to $2.0 \times 10^5$ and a number-average molecular weight ranging from $2.0 \times 10^2$ to $1.0 \times 10^5$ from the viewpoint of the image-forming ability.

Moreover, the alkali-soluble high molecular weight compounds carrying phenolic groups may be used alone or in any combination of at least two of them. When they are used in combination, they may be used in combination with polycondensates of phenols carrying an alkyl group having 3 to 8 carbon atoms as a substituent with formaldehyde such as polycondensates of t-butyl phenol with formaldehyde and those of octyl phenol with formaldehyde, as disclosed in U.S. Pat. No. 4,123,279.

These polycondensates likewise preferably have a weight-average molecular weight ranging from $5.0\times10^2$ to $2.0\times10^5$ and a number-average molecular weight ranging from $2.0\times10^2$ to $1.0\times10^5$.

(2) Examples of alkali-soluble high molecular weight compounds carrying sulfonamide groups include polymers mainly comprising compounds carrying sulfonamide groups as monomer units such as homopolymers of such monomers and copolymers obtained by copolymerizing the monomers with other polymerizable monomers.

Such a polymerizable monomer carrying a sulfonamide group may be ones consisting of low molecular weight compounds each having at least one sulfonamide group: —$SO_2$—NH— in which at least one hydrogen atom is bonded to the nitrogen atom and at least one polymerizable unsaturated bond in the molecule. Preferred are low molecular weight compounds each having an acryloyl group, an aryl group or a vinyloxy group and a substituted or monosubstituted aminosulfonyl group or a substituted sulfonylimino group, among others.

The foregoing low molecular weight compound may be, for instance, compounds represented by the following general formulas (a) to (e), but the present invention is not restricted to these specific compounds:

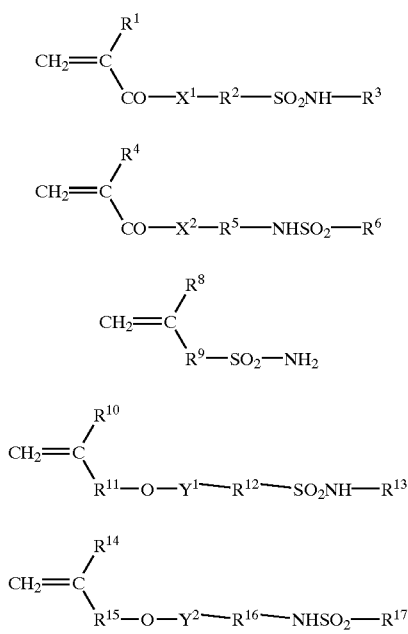

In the foregoing general formulas, $X^1$ and $X^2$ each independently represents an oxygen atom or a group: $NR^7$. The substituents $R^1$ and $R^4$ each independently represents a hydrogen atom or $CH_3$. $R^2$, $R^5$, $R^9$, $R^{12}$ and $R^{16}$ each independently represents an alkylene group having 1 to 12 carbon atoms, a cycloalkylene group, an arylene group or an aralkylene group, which may have a substituent. The substituents $R^3$, $R^7$ and $R^{13}$ each independently represents a hydrogen atom or an alkyl group having 1 to 12 carbon atoms, a cycloalkyl group, an aryl group or an aralkyl group, which may have a substituent. The substituents $R^6$ and $R^{17}$ each independently represents an alkyl group having 1 to 12 carbon atoms, a cycloalkyl group, an aryl group or an aralkyl group, which may have a substituent. The substituents $R^8$, $R^{10}$ and $R^{14}$ each independently represents a hydrogen atom or $CH_3$. $R^{11}$ and $R^{15}$ each independently represents a single bond or an alkylene group having 1 to 12 carbon atoms, a cycloalkylene group, an arylene group or an aralkylene group, which may have a substituent. $Y^1$ and $Y^2$ each independently represents a single bond or CO.

Among them, preferably used herein are, for instance, m-aminosulfonylphenyl methacrylate, N-(p-aminosulfonylphenyl) methacrylamide and N-(p-aminosulfonyl-phenyl) acrylamide.

(3) The alkali-soluble high molecular weight compound carrying active imide group may be, for instance, polymers comprising compounds carrying active imide groups as principal monomer units.

Examples of the alkali-soluble high molecular weight compound carrying active imide group may be, for instance, high molecular weight compounds such as those prepared by homopolymerizing monomers consisting of low molecular weight compounds each having, in the molecule, at least one active imide group represented by the formula: —CO—NH—$SO_2$— and at least one polymerizable unsaturated bond or those obtained by copolymerizing such monomers with other polymerizable monomers.

Specific examples of such compounds suitably used herein are N-(p-toluene-sulfonyl) methacrylamide and N-(p-toluenesulfonyl) acrylamide.

Examples of such compounds suitably used herein also include, in addition to those listed above, polymeric compounds obtained by polymerizing at least two polymerizable monomers selected from the group consisting of the foregoing polymerizable monomers each carrying a phenol group, polymerizable monomers each carrying a sulfonamide group and polymerizable monomers each carrying an active imide group, or polymeric compounds obtained by copolymerizing these at least two polymerizable monomers with other polymerizable monomers.

When copolymerizing a polymerizable monomer (M1) carrying a phenol group, a polymerizable monomer (M2) carrying a sulfonamide group and/or a polymerizable monomer (M3) carrying an active imide group, the mixing ratio of these monomers (M1: M2 and/or M3, by weight) preferably ranges from 50:50 to 5:95 and more preferably 40:60 to 10:90.

In case where the alkali-soluble polymeric compound is a copolymer comprising repeating units of a monomer carrying a group selected from the foregoing acidic groups (1) to (3) and repeating units of another polymerizable monomer, the resulting copolymer preferably comprises not less than 10 mole % and more preferably not less than 20 mole % of the repeating units derived from the monomer carrying a group selected from the foregoing acidic groups (1) to (3).

This is because if the content of the repeating units derived from the foregoing monomer is less than 10 mole %, the resulting polymeric compound does not have any sufficient solubility in an alkaline solution and this accordingly results in the reduction of the developing latitude.

The foregoing copolymer may be prepared by any conventionally known method such as graft copolymerization, block copolymerization and random copolymerization.

Other polymerizable monomers, which are copolymerized with the monomer carrying a group selected from the foregoing acidic groups (1) to (3) may, for instance, be those listed bellow as monomers (a) to (l), but the present invention is not restricted to these specific ones at all:

(a) Acrylic acid esters and methacrylic acid esters each carrying an aliphatic hydroxyl group such as 2-hydroxyethyl acrylate or 2-hydroxyethyl methacrylate;
(b) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(c) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(d) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(e) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(f) Vinyl esters such as vinyl acetate, vinyl chloroacetate, vinyl butyrate and vinyl benzoate;

(g) Styrenes such as styrene,α-methyl styrene, methyl styrene and chloromethyl styrene;

(h) Vinyl ketones such as methyl vinyl ketone, ethyl vinyl ketone, propyl vinyl ketone and phenyl vinyl ketone;

(i) Olefins such as ethylene, propylene, isobutylene, butadiene and isoprene;

(j) N-Vinyl pyrrolidone, N-vinyl carbazole, 4-vinyl pyridine, acrylonitrile, methacrylonitrile or the like;

(k) Unsaturated imides such as maleimide, N-acryloyl acrylamide, N-acetyl methacrylamide, N-propionyl methacrylamide and N-(p-chlorobenzoyl) methacrylamide; and (l) Unsaturated carboxylic acids such as acrylic acid, methacrylic acid, maleic anhydride and itaconic acid.

The foregoing alkali-soluble polymeric compound preferably has a weight-average molecular weight of not less than 2000, a number-average molecular weight of not less than 500, more preferably a weight-average molecular weight ranging from 5000 to 300,000, a number-average molecular weight ranging from 800 to 250,000 and a degree of dispersion (weight-average molecular weight/number-average molecular weight) ranging from 1.1 to 10, from the viewpoint of the film strength no matter what it is a homopolymers or a copolymer.

Moreover, in case where the alkali-soluble polymeric compound is, for instance, a phenol-formaldehyde resin or a cresol-aldehyde resin, the polymeric compound preferably has a weight-average molecular weight ranging from 500 to 20000 and a number-average molecular weight ranging from 200 to 10000.

The content of the alkali-soluble polymeric compound in the image-forming layer preferably ranges from 30 to 99% by weight, more preferably 40 to 95% by weight and most preferably 50 to 90% by weight on the basis of the total solid content, by weight, of the image-forming layer.

This is because if the content of the polymeric compound is less than 30% by weight, the resulting image-forming layer often has reduced durability, while if it exceeds 99% by weight, the sensitivity and durability of the layer may sometimes be reduced.

In addition, the foregoing polymeric compounds may be used alone or in any combination.

(C) The compound, which may be compatible with the alkali-soluble high molecular weight compound to thus reduce the solubility of the alkali-soluble high molecular weight compound in an alkaline aqueous solution and whose effect of reducing the solubility of the polymeric compound is lowered through heating The component (C) means a compound, which has good compatibility with the foregoing alkali-soluble polymeric compound (B) because of the action of the functional group capable of forming hydrogen bond present in the molecule, can form a coating liquid for a uniform image-forming layer and has a function (solubility-controlling action) of controlling the alkali-solubility of the alkali-soluble polymeric compound due to the interaction thereof with the polymeric compound.

Moreover, the component (C) loses the solubility-controlling effect on the alkali-soluble polymeric compound through heating. When the IR-absorbing agent is a compound, which can, in itself, be decomposed by heating, however, the effect of controlling the solubility of the alkali-soluble polymeric compound cannot sufficiently be reduced unless an energy sufficient for the decomposition thereof is provided by establishing a variety of conditions such as the laser output and exposure time period and the sensitivity of the resulting image-forming layer may be reduced. For this reason, the component (C) preferably has a thermal decomposition temperature of not less than 150° C.

The component (C) can appropriately be selected from compounds capable of undergoing interaction with the foregoing alkali-soluble polymeric compound, such as sulfone compounds, ammonium salts, phosphonium salts and amide compounds, while taking into consideration the interaction thereof with the alkali-soluble polymeric compound (B).

In particular, when a novolak resin is, for instance, used alone as the component (B), "component (A+C)" as will be detailed below is preferred, with the following substances such as Cyanine Dye A being more preferred. The component (A+C) will be detailed below.

In general, the mixing ratio of the component (C) to the alkali-soluble polymeric compound (B) (C/B) preferably ranges from 1/99 to 25/75.

If the foregoing mixing ratio is less than 1/99 or the amount of the component (C) is too small, the component (C) insufficiently interacts with the alkali-soluble polymeric compound and cannot reduce the solubility in an alkaline solution. This accordingly makes it difficult to form good images. On the other hand, if the mixing ratio exceeds 25/75 or the amount of the component (C) is too large, the component (C) unreasonably interacts with the alkali-soluble polymeric compound (B) and the sensitivity of the resulting image-forming layer is often reduced significantly.

The component (A+C)

A compound (the component (A+C)) possessing the characteristic properties of the both components (A) and (C) may be substituted for the foregoing component (A) and the component (C).

The foregoing component (A+C) is a basic dye, which can absorb light rays to thus generate heat (characteristic properties of the component (A)), which has an absorption region falling within the wavelength range of from 700 to 1200 nm and which can be well compatible with the alkali-soluble polymeric compound.

The component (A+C) has, in the molecule, a group capable of interacting with the alkali-soluble polymeric compound (characteristic properties of the component (C)) such as an ammonium group or an iminium group and therefore, the component can undergo the interaction with the alkali-soluble polymeric compound to thus control the alkali-solubility thereof.

Examples of the foregoing components (A+C) may be those represented by the following general formula (Z):

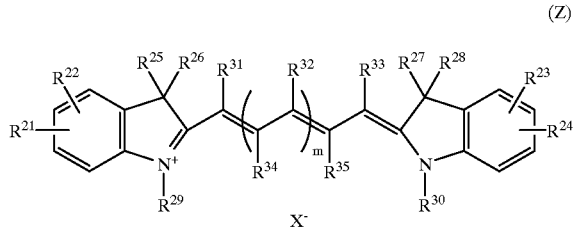

(Z)

In the foregoing general formula (Z), the substituents $R^{21}$ to $R^{24}$ independently represent a hydrogen atom or an alkyl group having 1 to 12 carbon atoms, an alkenyl group, an alkoxy group, a cycloalkyl group or an aryl group, which may have a substituent, provided that $R^{21}$ and $R^{22}$ or $R^{23}$ and $R^{24}$ may be bonded together to form a ring structure.

Specific examples of the substituents $R^{21}$ to $R^{24}$ are a hydrogen atom, a methyl group, an ethyl group, a phenyl group, a dodecyl group, a naphthyl group, a vinyl group, an allyl group and a cyclohexyl group and these groups may have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In the foregoing general formula, the substituents $R^{25}$ to $R^{30}$ each independently represents an alkyl group having 1 to 12 carbon atoms, which may have a substituent and specific examples thereof are methyl, ethyl, phenyl, dodecyl, naphthyl, vinyl, allyl and cyclohexyl groups and these groups may have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In the foregoing general formula, the substituents $R^{31}$ to $R^{33}$ may independently represent a hydrogen atom, a halogen atom, or an alkyl group having 1 to 8 carbon atoms, which may further have a substituent, provided that the substituent $R^{32}$ may be bonded to the substituent $R^{31}$ or $R^{33}$ to form a ring structure and that in case of m>2, a plurality of the substituents $R^{32}$ may be bonded together to form a ring structure.

Specific examples of the foregoing substituents $R^{31}$ to $R^{33}$ are a chlorine atom, a cyclohexyl group or, a cyclopentyl ring or a cyclohexyl ring formed through coupling of the plurality of the substituents $R^{32}$. These groups may further have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In addition, m is an integer falling within the range of from 1 to 8 and preferably 1 to 3.

In the foregoing general formula, substituents $R^{34}$ to $R^{35}$ may independently represent a hydrogen atom, a halogen atom, or an alkyl group having 1 to 8 carbon atoms, which may further have a substituent, provided that the substituent $R^{34}$ may be bonded to the substituent $R^{35}$ to form a ring structure and that in case of m>2, a plurality of the substituents $R^{34}$ may be bonded together to form a ring structure.

Specific examples of the foregoing substituents $R^{34}$ to $R^{35}$ are a chlorine atom, a cyclohexyl group or, a cyclopentyl ring or a cyclohexyl ring formed through coupling of the plurality of the substituents $R^{34}$. These groups may further have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In addition, m is an integer falling within the range of from 1 to 8 and preferably 1 to 3.

In the foregoing formula, $X^-$ represents an anion such as a perchlorate ion, a tetrafluoroborate ion, a hexafluorophosphate ion, a triisopropylnaphthalene sulfonate ion, a 5-nitro-O-toluenesulfonate ion, a 5-sulfosalicylate ion, a 2,5-dimethylbenzene-sulfonate ion, a 2,4,6-trimethylbenzenesulfonate ion, a 2-nitrobenzenesulfonate ion, a 3-chlorobenzenesulfonate ion, a 3-bromobenzenesulfonate ion, a 2-fluorocaprylnaphthalenesulfonate ion, a dodecylbenzenesulfonate ion, a 1-naphthol-5-sulfonate ion, a 2-methoxy-4-hydroxy-5-benzoyl-benzenesulfonate ion and a p-toluenesulfonate ion.

Among these ions, preferred are alkyl aromatic sulfonate ions such as a hexafluorophosphate ion, a triisopropylnaphthalene sulfonate ion and a 2,5-dimethyl-benzenesulfonate ion.

The compound represented by the foregoing general formula (Z) is in general a compound called cyanine dye and more specifically, the following compounds are preferably used in the invention, but the present invention is not restricted to these specific compounds.

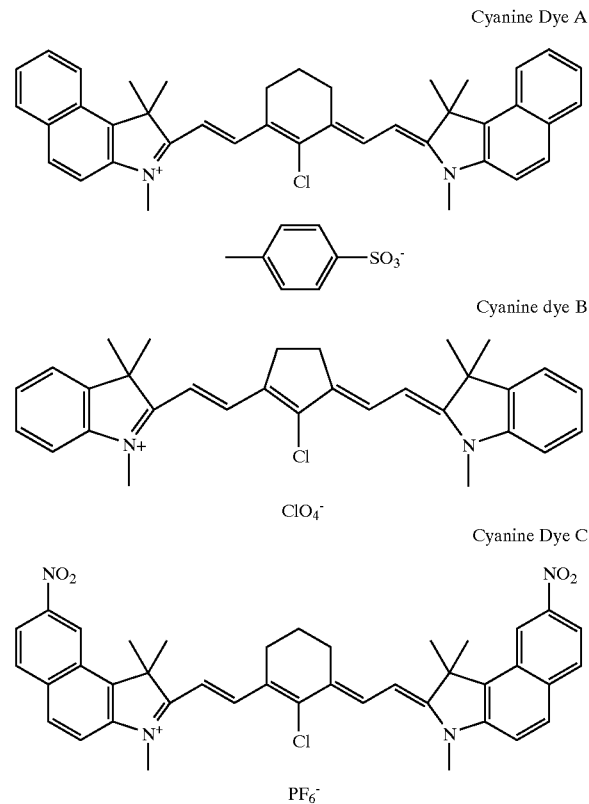

Cyanine Dye A

Cyanine dye B

Cyanine Dye C

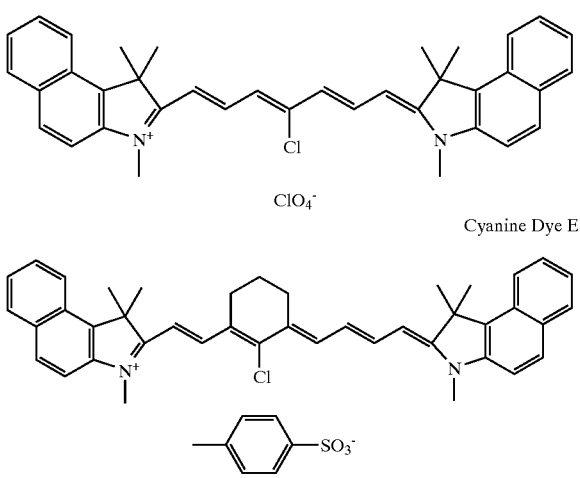

Cyanine Dye D

Cyanine Dye E

In case where the foregoing component (A+C) possessing the characteristic properties of the foregoing components (A) and (C) is substituted for these components (A) and (C), the ratio of the amount of the component (A+C) to that of the component (B) [(A+C)/(B)] preferably ranges from 1/99 to 30/70 and more preferably 1/99 to 25/75.

(D) The Cyclic Acid Anhydride

In the lithographic printing plate precursor, a cyclic acid anhydride may be further used. The cyclic acid anhydride has, within the structure thereof, a bond conjugated with the carbonyl group of a carboxylic acid anhydride, can control the decomposition rate of the carboxylic anhydride through the improvement of the stability of the carbonyl group and can generate an acid at an appropriate rate during storage and with the elapse of time. For this reason, the cyclic acid anhydride can control the deterioration of the developing ability of the lithographic printing plate precursor thus permits the stable maintenance of the developing ability thereof over a long period of time.

Examples of the foregoing cyclic acid anhydrides are compounds represented by the following general formula (III) or (IV):

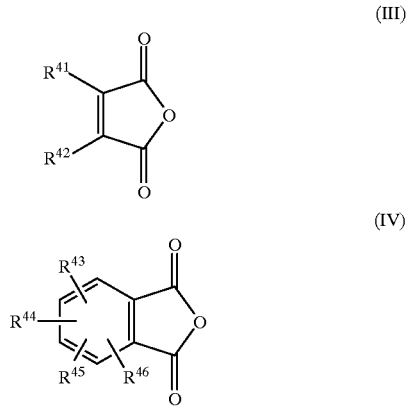

In the general formula (III), the substituents $R^{41}$ and $R^{42}$ independently represent a hydrogen atom, or an alkyl group having 1 to 12 carbon atoms, an alkenyl group, an alkoxy group, a cycloalkyl group, an aryl group, a carbonyl group, a carboxyl group or a carboxylic acid ester residue, which may have a substituent. In this respect, the substituents $R^{41}$ and $R^{42}$ may be bonded together to form a ring structure.

Examples of the foregoing substituents $R^{41}$ and $R^{42}$ suitably used herein are a hydrogen atom, or an unsubstituted alkyl group having 1 to 12 carbon atoms, an aryl group, an alkenyl group or a cycloalkyl group, and specific examples thereof are a hydrogen atom or a methyl, ethyl, phenyl, dodecyl, naphthyl, vinyl allyl or cyclohexyl group, and these groups may further have a substituent.

In case where $R^{41}$ and $R^{42}$ are bonded together to form a ring structure, examples of such cyclic groups are phenylene, naphthylene, cyclohexene and cyclopentene groups.

Examples of the foregoing substituents are halogen atoms, a hydroxyl group, a carbonyl group, a sulfonic acid ester residue, a nitro group and a nitrile group.

In the foregoing general formula (IV), the substituents $R^{43}$ to $R^{46}$ independently represent a hydrogen atom, a hydroxyl group, a halogen atom such as a chlorine atom, a nitro group, a nitrile group, or an alkyl group having 1 to 12 carbon atoms, an alkenyl group, an alkoxy group, a cycloalkyl group, an aryl group, a carbonyl group, a carboxyl group or a carboxylic acid ester residue, which may have a substituent.

Examples of the foregoing substituents $R^{43}$ to $R^{45}$ suitably used herein are a hydrogen atom, halogen atoms, alkyl groups having 1 to 12 carbon atoms, alkenyl groups and aryl groups having 6 to 12 carbon atoms and specific examples thereof are methyl, vinyl, phenyl and allyl groups. These groups may further have substituents.

Examples of such substituents are halogen atoms, hydroxyl group, carbonyl group, sulfonic acid ester residues, nitro group, nitrile group and carboxyl group.

Examples of the cyclic acid anhydrides suitably used herein are phthalic acid anhydride, 3,4,5,6-tetrahydrophthalic acid anhydride, tetrachlorophthalic acid anhydride, 3-hydroxyphthalic acid anhydride, 3-methylphthalic acid anhydride, 3-phenylphthalic acid anhydride, trimellitic acid anhydride, pyromellitic acid anhydride, maleic acid anhydride, phenyl maleic acid anhydride, dimethyl maleic acid anhydride, dichloromaleic acid anhydride and chloromaleic acid anhydride.

The content of the cyclic acid anhydride present in the image-forming layer preferably ranges from 0.5 to 20% by weight, more preferably 1 to 15% by weight and most preferably 1 to 10% by weight on the basis of the total solid content, by weight, of the image-forming layer. If the content of the cyclic acid anhydride is less than 0.5% by weight, the effect of maintaining the developing ability is sometimes insufficient, while if the content thereof exceeds 20% by weight, the resulting image-forming layer cannot often form any image.

The following are components for constituting the recording layer for a negative lithographic printing plate.

(E) The Compound Capable of Generating Acid Through Heating

If the image-forming material is a negative type one, a compound (hereunder referred to as "acid-generating agent") capable of generating an acid upon heating is simultaneously used. This acid-generating agent is decomposed when it is heated to a temperature of not less than 100° C. to thus increase the amount of an acid-generating compound. The acid thus generated is preferably a strong acid having a pKa value of not more than 2 such as sulfonic acid or hydrochloric acid.

Examples of such acid-generating agents are preferably onium salts such as iodonium salts, sulfonium salts, phosphonium salts and diazonium salts. Specific examples thereof are compounds disclosed in, for instance, U.S. Pat.

No. 4,708,925 and Japanese Un-Examined Patent Publication No. Hei 7-20629, with iodonium salts, sulfonium salts and diazonium salts, whose counterions are sulfonate ions, among others.

Examples of the foregoing diazonium salts suitably used herein are diazonium salt compounds disclosed in U.S. Pat. No. 3,867,147, diazonium compounds disclosed in U.S. Pat. No. 2,632,703 and diazo resins such as those disclosed in Japanese Un-Examined Patent Publication Nos. Hei 1-102456 and Hei 1-102457.

Diazonium salts preferably used herein also include benzyl sulfonates disclosed in U.S. Pat. Nos. 5,135,838 and 5,200,544, and active sulfonic acid esters and disulfonyl compounds disclosed in Japanese Un-Examined Patent Publication Nos. Hei 2-100054, Hei 2-100055 and Hei 8-9444. Moreover, preferred also include haloalkyl-substituted S-triazines disclosed in Japanese Un-Examined Patent Publication No. Hei 7-271029.

The amount of the foregoing acid-generating agent to be incorporated preferably ranges from 0.01 to 50% by weight, more preferably 0.1 to 40% by weight and most preferably 0.5 to 30% by weight on the basis of the total solid content, by weight, of the image-forming layer.

(F) Crosslinking Agents Capable of Undergoing Crosslinking by the Action of Acids In case where the lithographic printing plate precursor is a negative type one, a crosslinking agent capable of causing crosslinking by the action of an acid (hereunder simply referred to as "crosslinking agent") is used in combination.

Examples of the foregoing crosslinking agents include those listed below:

(i) Aromatic compounds substituted with an alkoxymethyl or hydroxymethyl group;
(ii) Compounds having an N-hydroxymethyl, N-alkoxymethyl or N-acyloxymethyl group; and
(iii) Epoxy compounds.

Examples thereof also include those disclosed in Japanese Un-Examined Patent Publication No. Hei 11-254850 and phenol derivatives.

The amount of the crosslinking agent to be added to the image-forming layer preferably ranges from 5 to 80% by weight, more preferably 10 to 75% by weight and most preferably 20 to 70% by weight on the basis of the total solid content, by weight, of the image-forming layer.

When the foregoing phenol derivative is used as a crosslinking agent, the amount of the phenol derivative to be incorporated into the image-forming layer preferably ranges from 5 to 70% by weight and more preferably 10 to 50% by weight on the basis of the total solid content, by weight, of the image-forming layer.

The details of the foregoing various kinds of compounds are disclosed in Japanese Un-Examined Patent Publication No. 2000-267265.

Other Components

Moreover, a variety of additives may, if necessary, be added to the image-forming layer of a lithographic printing plate precursor to which the alkaline developing liquid of the invention is applied.

For instance, known additives such as cyclic acid anhydrides, phenols, organic acids and sulfonyl compounds may simultaneously be used in order to improve the sensitivity of the image-forming layer.

As the foregoing cyclic acid anhydrides, there may be listed, for instance, tetrahydrophthalic acid anhydride, hexahydrophthalic acid anhydride, 3,6-endooxy-$\Delta^4$-tetrahydrophthalic acid anhydride, α-phenylmaleic acid anhydride, succinic acid anhydride and pyromellitic acid anhydride disclosed in U.S. Pat. No. 4,115,128.

Examples of phenols are bisphenol A, p-nitrophenol, p-ethoxyphenol, 2,4,4'-tri-hydroxybenzophenone, 2,3,4-trihydroxybenzophenone, 4-hydroxybenzophenone, 4,4',4"-trihydroxy-triphenyl methane and 4,4',3",4"-tetrahydroxy-3,5,3',5'-tetramethyl-triphenyl methane.

Examples of the foregoing organic acids are those disclosed in, for instance, Japanese Un-Examined Patent Publication Nos. Sho 60-88942 and Hei 2-96755 such as sulfonic acids, sulfinic acids, alkyl sulfuric acids, phosphonic acids, phosphoric acid esters and carboxylic acids and more specifically, they include, for instance, p-toluenesulfonic acid, dodecylbenzenesulfonic acid, p-toluenesulfinic acid, ethyl sulfuric acid, phenyl phosphonic acid, phenyl phosphinic acid, phenyl phosphate, diphenyl phosphate, benzoic acid, isophthalic acid, adipic acid, p-toluylic acid, 3,4-dimethoxy benzoic acid, phthalic acid, terephthalic acid, 4-cyclohexene-2,2-dicarboxylic acid, erucic acid, lauric acid, n-undecanoic acid and ascorbic acid.

As the sulfonyl compounds, there may be listed, for instance, bishydroxyphenyl sulfone, methylphenyl sulfone and diphenyl disulfone.

The amount of the foregoing additional additives such as cyclic acid anhydrides, phenols, organic acids or sulfonyl compounds to be incorporated into the image-forming layer preferably ranges from 0.05 to 20% by weight, more preferably 0.1 to 15% by weight and most preferably 0.1 to 10% by weight based on the total solid content, by weight, of the image-forming layer.

It is also possible to add, to the image-forming layer, a nonionic surfactant such as those disclosed in Japanese Un-Examined Patent Publication Nos. Sho 62-251740 and Hei 3-208514 and/or an amphoteric surfactant such as those disclosed in Japanese Un-Examined Patent Publication Nos. Sho 59-121044 and Hei 4-13149 in order to improve the stability of processability to developing conditions.

Examples of such nonionic surfactants are sorbitan tristearate, sorbitan monopalmitate, sorbitan trioleate, stearic acid monoglyceride and polyoxyethylene nonyl phenyl ether.

Examples of amphoteric surfactants are alkyl-di (aminoethyl) glycine, alkyl polyaminoethyl glycine hydrochloride, 2-alkyl-N-carboxyethyl-N-hydroxyethyl imidazolinium betaine and N-tetradecyl-N,N-betaine type ones (such as Amogen K available from Dai-Ichi Kogyo (K.K.)).

The amount of the foregoing nonionic or amphoteric surfactant to be incorporated into the image-forming layer preferably ranges from 0.05 to 15% by weight and more preferably 0.1 to 5% by weight on the basis of the total solid content, by weight, of the image-forming layer.

It is also possible to add, to the foregoing image-forming layer, an agent for obtaining a visible image immediately after heating through imagewise exposure (hereunder referred to as "printing-out agent") and/or a dye or a pigment as an image-coloring agent.

As the printing-out agent, there may be used, for instance, a combination of a compound capable of generating an acid upon heating through exposure and an organic dye capable of forming a salt with the acid-generating compound.

Specific examples thereof include a combination of an o-naphthoquinone-diazide-4-sulfonic acid halogenide with a salt-forming organic dye disclosed in Japanese Un-Examined Patent Publication Nos. Sho 50-36209, Sho 53-8128 and a combination of a trihalomethyl compound with a salt-forming organic dye disclosed in Japanese Un-Examined Patent Publication Nos. Sho 53-36223, Sho 54-74728, Sho 60-3626, Sho 61-143748, Sho 61-151644 and Sho 63-58440.

The foregoing trihalomethyl compound may be, for instance, oxazole compounds and triazines compounds and they are both excellent in stability with time and can provide clear printed out images.

The foregoing image-coloring agent usable herein may be, for instance, the aforementioned salt-forming organic dyes as well as other dyes and preferably used herein include, for instance, oil-soluble dyes and basic dyes.

Specific examples thereof are Oil Yellow #101, Oil Yellow #103, Oil Pink #312, Oil Green BG, Oil Blue BOS, Oil Blue #603, Oil Black BY, Oil Black BS, Oil Black T-505 (all of these coloring agents are available from ORIENT Chemical Industries, Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015). Moreover, dyes disclosed in Japanese Un-Examined Patent Publication No. Sho 62-293247 are particularly preferably used in the present invention.

The amount of the foregoing various kinds of dyes to be added to the image-forming layer preferably ranges from 0.01 to 10% by weight and more preferably 0.1 to 3% by weight on the basis of the total solid content, by weight, of the image-forming layer.

A plasticizer may likewise be added, if necessary, to the image-forming layer in order to impart flexibility to the resulting coated film.

Examples of such plasticizers are butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers or polymers of acrylic acid or methacrylic acid.

Moreover, the image-forming layer may, if necessary, comprise a variety of additives listed below.

For instance, onium salts, o-quinonediazide compounds, aromatic sulfone compounds and aromatic sulfonic acid ester compounds may simultaneously be used, these compounds being thermally decomposable and capable of substantially reducing the solubility of the alkali-soluble polymeric compound when it is not thermally decomposed. The addition of the compound is preferred to improve the ability of inhibiting any dissolution of the image area in a developer.

Examples of the foregoing onium salts are diazonium salts, ammonium salts, phosphonium salts, iodonium salts, sulfonium salts, selenonium salts and arsonium salts.

Among these, there may specifically be listed, for instance, diazonium salts disclosed in S. I. Schlesinger, Photogr. Sci. Eng., 1974, 18:387, T. S. Bal et al., Polymer, 1980, 21:423 and Japanese Un-Examined Patent Publication No. Sho 5-158230; ammonium salts disclosed in U.S. Pat. Nos. 4,069,055 and 4,069,056 and Japanese Un-Examined Patent Publication No. Hei. 3-140140; phosphonium salts disclosed in D.C. Necker et al., Macromolecules, 1984, 17:2468, C. S. Wen et al., The Proc. Conf. Rad. Curing ASIA, p478 Tokyo, Oct (1988) and U.S. Pat. Nos. 4,069,055 and 4,069,056; iodonium salts disclosed in J. V. Crivelloet et al., Macromolecules, 1977, 10(6), p. 1307, Chem. & Eng. News, Nov. 28, p.31 (1988), European Patent No. 104,143, U.S. Pat. Nos. 339,049 and 410,201 and Japanese Un-Examined Patent Publication Nos. Hei 2-150848 and Hei 2-296514; sulfonium salts disclosed in J. V. Crivello et al., Polymer J., 1985, 17:73, J. V. Crivello et al., J. Org. Chem., 1978, 43:3055, W. R. Watt et al., J. Polymer Sci., Polymer Chem. Ed., 1984, 22:1789, J. V. Crivello et al., Polymer Bull., 1985, 14:279, J. V. Crivello et al., Macromolecules, 1981, 14(5):1141, J. V. Crivello et al., J. Polymer Sci., Polymer Chem. Ed., 1979, 17:2877, European Patent Nos. 370,693, 233,567, 297,443 and 297,442, U.S. Pat. Nos. 4,933,377, 3,902,114, 410,201, 399,049, 4,760, 013, 4,734,444 and 2,833,827, and German Patent Nos. 2,904,626, 3,604,580 and 3,604,581; selenonium salts disclosed in J. V. Crivelloet et al., Macromolecules, 1977, 10(6), p. 1307 and J. V. Crivello et al., J. Polymer Sci., Polymer Chem. Ed., 1979, 17:1047; and arsonium salts disclosed in C. S. Wen et al., The Proc. Conf. Rad. Curing ASIA, p478 Tokyo, Oct (1988).

Among the onium salts listed above, preferred are diazonium salts, with those disclosed in Japanese Un-Examined Patent Publication No. Hei 5-158230 being more preferred.

Counter ions for these onium salts may be, for instance, tetrafluoroborate, hexafluorophosphate, triisopropylnaphthalene sulfonate, 5-nitro-o-toluene sulfonate, 5-sulfosalicylate, 2,5-dimethylbenzene sulfonate, 2,4,6-trimethylbenzene sulfonate, 2-nitrobenzene sulfonate, 3-chlorobenzene sulfonate, 3-bromobenzene sulfonate, 2-fluorocaprylnaphthalene sulfonate, dodecylbenzene sulfonate, 1-naphthol-5-sulfonate, 2-methoxy-4-hydroxy-5-benzoyl-benzenesulfonate and p-toluenesulfonate ions.

Among these, preferred are hexafluorophosphate, and alkyl aromatic sulfonate such as triisopropylnaphthalene sulfonate and 2,5-dimethylbenzene sulfonate ions.

Examples of the foregoing o-quinonediazide compounds are those having at least one o-quinonediazide group and capable of increasing the alkali-solubility through thermal decomposition and the compounds may have a variety of structures.

The o-quinonediazide loses the ability of inhibiting the dissolution of a binder and the o-quinonediazide per se is converted into an alkali-soluble substance, through thermal decomposition. The o-quinonediazide is involved in the improvement of the solubility of the lithographic printing plate precursor.

Examples of such o-quinonediazide compounds usable herein are those disclosed in J. Coaser, "Light-Sensitive Systems", John Wiley & Sons Inc., pp. 339–352 and preferred are sulfonic acid esters or sulfonic acid amides reacted with a variety of aromatic polyhydroxy compounds or aromatic amino compounds among others.

In addition, preferably used herein also include benzoquinone-(1,2)-diazide sulfonic acid chloride disclosed in Japanese Un-Examined Patent Publication No. Sho 43-28403 or esters of benzoquinone-(1,2)-diazide sulfonic acid chloride or naphthoquinone-(1,2)-diazide-5-sulfonic acid chloride disclosed in U.S. Pat. Nos. 3,046,120 and 3,188,210.

Furthermore, also preferred are esters of naphthoquinone-(1,2)-diazide-4-sulfonic acid chloride with phenol-formaldehyde resins or cresol-formaldehyde resins and esters of naphthoquinone-(1,2)-diazide-4-sulfonic acid chloride with pyrogallol-acetone resins.

In addition, effectively used herein also include those disclosed in, for instance, Japanese Un-Examined Patent Publication Nos. Sho 47-5303, Sho 48-63802, Sho 48-63803, Sho 48-96575, Sho 49-38701 and Sho 48-13354, Japanese Examined Patent Publication Nos. Sho 41-11222, Sho 45-9610 and Sho 49-17481, U.S. Pat. Nos. 2,797,213, 3,454,400, 3,544,323, 3,573,917, 3,674,495 and 3,785,825, G.B. Patent Nos. 1,227,602, 1,251,345, 1,267,005, 1,329, 888 and 1,330,932 and German Patent No. 854,890.

These compounds may be used alone or a mixture comprising a combination of several compounds.

The amount of these optional additives such as onium salts, o-quinonediazide compounds and aromatic sulfonic acid esters to be incorporated into the image-forming layer preferably ranges from 0.1 to 50% by weight, more preferably 0.5 to 30% by weight and most preferably 0.5 to 20% by weight on the basis of the total solid content, by weight, of the image-forming layer.

Substrate

The substrate to which the image-forming layer is applied may be, for instance, a pure aluminum plate, aluminum alloy plates, and plastic films that are laminated with aluminum or on which aluminum is vapor-deposited.

The surface of the aluminum plate is preferably subjected to a surface-treatment such as graining, immersion in an aqueous solution of, for instance, sodium silicate, potassium fluorozirconate or a phosphate, or anodization.

In addition, preferably used herein also include, for instance, an aluminum plate, which is subjected to a graining treatment and then to an immersion treatment using an aqueous sodium silicate solution, as disclosed in U.S. Pat. No. 2,714,066 and an aluminum plate, which is anodized and then immersed in an aqueous alkali metal silicate solution, as disclosed in Japanese Examined Patent Publication No. Sho 47-5125.

The foregoing anodization treatment is carried out by, for instance, passing an electric current through an electrolyte such as an aqueous or non-aqueous solution containing, for instance, an inorganic acid such as sulfuric acid, phosphoric acid, chromic acid, nitric acid or boric acid, an organic acid such as oxalic acid or sulfamic acid or a salt thereof, wherein these aqueous and non-aqueous solutions may be used alone or in any combination, while using an aluminum plate as an anode.

It is also effective to use the silicate-electrodeposition disclosed in U.S. Pat. No. 3,658,662.

Moreover, useful substrates also include, for instance, those subjected to an electrolytic graining treatment and then the foregoing anodization treatment, such as those disclosed in U.S. Pat. No. 4,087,341, Japanese Examined Patent Publication No. Sho 46-27481 and Japanese Un-Examined Patent Publication No. Sho 52-30503.

Useful substrates also include, for instance, aluminum plates each subjected to, in order, surface-graining, chemical etching and anodization, as disclosed in U.S. Pat. No. 3,834,998.

The substrate is subjected to these surface-treatments for a variety of purposes, for instance, for making the surface of the substrate hydrophilic, for preventing the occurrence of any detrimental reaction between the substrate and the image-forming layer applied thereto and for improving the adhesion of the substrate surface to the image-forming layer.

A lithographic printing plate precursor can be prepared by applying an image-forming layer as a light-sensitive layer onto the surface of a desired substrate, but a primary layer may, if necessary, be formed on the substrate prior to the formation of the image-forming layer.

Such a primary layer may be formed from a variety of organic compounds, for instance, carboxymethyl cellulose, dextrin, gum Arabic, phosphonic acids carrying an amino group such as 2-aminoethyl phosphonic acid; organic phosphonic acids, which may have a substituent, such as phenyl phosphonic acid, naphthyl phosphonic acid, alkyl phosphonic acid, glycerophosphonic acid, methylenediphosphonic acid and ethylenediphosphonic acid; organic phosphoric acid, which may have a substituent, such as phenyl phosphoric acid, naphthyl phosphoric acid, alkyl phosphoric acid and glycerophosphoric acid; organic phosphinic acids, which may have a substituent, such as phenyl phosphinic acid, naphthyl phosphinic acid, alkyl phosphinic acid and glycerophosphinic acid; amino acids such as glycine and β-alanine; and hydrochlorides of amines having a hydroxyl group such as triethanolamine hydrochloride.

The foregoing organic compounds may be used alone or in any combination thereof. In a preferred embodiment, the foregoing diazonium salt is applied onto the substrate to form such a primarly layer.

An organic primary layer comprising at least one organic polymeric compound, which comprises repeating units represented by the following general formula (V) may preferably be used as the foregoing primary layer:

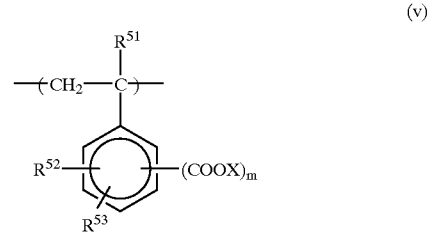

(v)

In the general formula (V), the substituent $R^{51}$ represents a hydrogen atom, a halogen atom or an alkyl group, the substituents $R^{52}$ and $R^{53}$ independently represent a hydrogen atom, a halogen atom, a hydroxyl group, an alkyl group, a substituted alkyl group, an aryl group, a substituted aryl group, $-OR^{54}$, $-COOR^{55}$, $-CONHR^{56}$, $-COR^{57}$ or $-CN$, the foregoing substituents $R^{52}$ and $R^{53}$ may be bonded together to form a ring structure. In this respect, the substituents $R^{54}$ to $R^{57}$ independently represent an alkyl group or an aryl group. X represents a hydrogen atom, a metal atom or $-NR^{58}R^{59}R^{60}R^{61}$, wherein the foregoing substituents $R^{58}$ to $R^{61}$ independently represent a hydrogen atom, an alkyl group, a substituted alkyl group, an aryl group or a substituted aryl group, provided that $R^{58}$ and $R^{59}$ may be bonded together to form a ring structure. m is an integer ranging from 1 to 3.

The dry coated amount of the foregoing primary layer preferably falls within the range of from 2 to 200 mg/m$^2$ and more preferably 5 to 100 mg/m$^2$. If the dry coated amount thereof is less than 2 mg/m$^2$, the resulting coated film does not provide desired characteristic properties. On the other hand, if it exceeds 200 mg/m$^2$, any further effect thereof cannot be expected.

The foregoing primary layer can be formed by the following method.

More specifically, the primary layer may be formed by, for instance, a method comprising the steps of coating, onto a substrate such as an aluminum plate, a primary layer-forming solution prepared by dissolving the foregoing organic compound in a solvent such as water, an organic solvent such as methanol, ethanol or methyl ethyl ketone or a mixture thereof and then drying the coated layer; or a method comprising the steps of dipping a substrate such as an aluminum plate in a primary layer-forming solution prepared by dissolving the foregoing organic compound in a solvent such as water, an organic solvent such as methanol, ethanol or methyl ethyl ketone or a mixture thereof to thus adsorb the organic compound on the substrate surface, washing with, for instance, water and drying.

In the former method, it is preferred to use a primary layer-forming solution containing the organic compound in a concentration ranging from 0.005 to 10% by weight.

On the other hand, in the latter method, it is preferred to use a primary layer-forming solution containing the organic compound in a concentration ranging from 0.01 to 20% by weight and more preferably 0.05 to 5% by weight. In addition, the dipping temperature preferably ranges from 20 to 90° C. and more preferably 25 to 50° C. In this case, the dipping time preferably ranges from 0.1 second to 20 minutes and more preferably 2 second to one minute.

To the foregoing primary layer-forming solution, there may be added a basic substance such as ammonia, triethylamine or potassium hydroxide or an acidic substance such as hydrochloric acid or phosphoric acid to thus control the pH value thereof to 1 to 12.

A yellow dye may additionally be incorporated into the solution to improve the tone reproduction of the resulting layer.

A lithographic printing plate precursor, which is developed using the alkali liquid developer according to the present invention, is in general prepared by dissolving the foregoing various kinds of components (the components (A) to (F) and other components) in a solvent to give a coating liquid for forming an image-forming layer and then applying the coating liquid onto a desired substrate.

Examples of such solvents are ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethyl formamide, tetramethylurea, N-methyl pyrrolidone, dimethyl sulfoxide, sulfolane, α-butyrolactone, and toluene, but the present invention is not restricted to these specific examples.

The foregoing solvents may be used alone or in any combination of at least two of them.

The total solid content of the foregoing various kinds of components (the components (A) to (F) and other components) in the solvent preferably falls within the range of from 1 to 50% by weight.

In general the dry coated amount (solid content) of the image-forming layer, which is formed by applying the foregoing coating liquid onto a substrate and then drying the coated layer preferably ranges from 0.5 to 5.0 g/m².

The coating liquid for forming an image-forming layer can be applied onto the surface of a substrate by a method selected from a variety of known methods such as bar coater coating, whirler coating, spray coating, curtain coating, dip coating, air knife coating, grade coating and roll coating.

The smaller the coated amount of the coating liquid, the higher the apparent sensitivity of the resulting image-forming layer, but the film characteristic properties of the layer are lowered.

A surfactant such as a fluorine-containing surfactant disclosed in Japanese Un-Examined Patent Publication No. Sho 62-170950 can be incorporated into the coating liquid for forming an image-forming layer in order to improve the coating characteristics of the liquid. The amount thereof to be added preferably ranges from 0.01 to 1% by weight and more preferably 0.05 to 0.5% by weight on the basis of the total solid content of the image-forming layer.

The lithographic printing plate precursor used in the present invention can be recorded with an IR laser and further the printing plate precursor can likewise be recorded by a UV lamp or can thermally be recorded using, for instance, a thermal head.

The foregoing IR laser is preferably a laser emitting IR rays having a wavelength ranging from 700 to 1200 nm and more preferably a solid state laser or a semiconductor laser capable of emitting infrared rays having a wavelength falling within the same range specified above.

The present invention will hereinafter be explained in more detail with reference to the following non-limitative working Examples.

EXAMPLES

<Preparation of Lithographic Printing Plate Precursor>

An aluminum plate of 0.3 mm thick (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3g/m². Then it was anodized in a 7% aqueous solution of sulfuric acid at a DC current density of 15 A/dm² so that the thickness of the resulting anodized layer was 3 g/m², washed with water, and then dried. Thereafter, the aluminum plate was treated with a 2.5% aqueous solution of sodium silicate at 30° C. for 10 seconds, coated with the following coating solution of primary layer, and dried under 80° C. for 15 seconds to obtain a substrate. The coated amount of the primary layer after drying was 15mg/m².

| <Coating Solution of Primary Layer> | |
|---|---|
| Copolymer P (molecular weight: 28,000) represented by the formula below | 0.3 g |
| Methanol | 100 g |
| Water | 1 g |

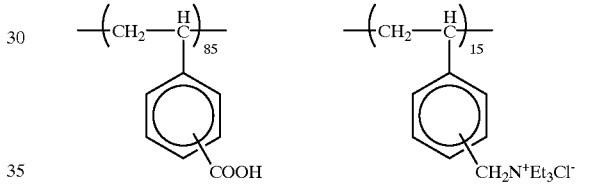

Copolymer P

<Synthesis of Specific Copolymer>

Example of Synthesis (Specific Copolymer 1)

To a 500 ml volume three-necked flask equipped with a stirring machine, a cooling tube and a dropping funnel, there were added 31.0 g (0.36 mole) of methacrylic acid, 39.1 g (0.36 mole) of ethyl chloroformate and 200 ml of acetonitrile and then the resulting mixture was stirred while cooling it in an ice-water bath. To this mixture, there was dropwise added 36.4 g (0.36 mole) of triethylamine through the dropping funnel over about one hour. After the completion of the dropwise addition, the ice-water bath was removed and the mixture was stirred at room temperature for 30 minutes. To this reaction mixture, there was added 51.7 g (0.30 mole) of p-aminobenzene sulfonamide and the resulting mixture was stirred over one hour while warming the mixture at 70° C. in an oil bath. After the completion of the reaction, the mixture was introduced into 1 L of water while stirring the water and the resulting mixture was stirred for 30 minutes. This mixture was filtered to recover the precipitates, followed by addition of 500 ml of water to the precipitates to give a slurry, filtration of the slurry and drying the resulting solid to give N-(p-aminosulfonylphenyl) methacrylamide as a white solid (yield 46.9 g).

Then there were added 4.61 g (0.0192 mole) of N-(p-aminosulfonylphenyl) methacrylamide, 2.94 g (0.0258 mole) of ethyl methacrylate, 0.80 g (0.015 mole) of acrylonitrile and 20 g of N,N-dimethyl acetamide to a 20 ml volume three-necked flask equipped with a stirring machine, a cooling tube and a dropping funnel, followed by stirring the resulting mixture while heating it to 65° C. in a hot water bath. To this mixture, there was added 0.15 g of "V-65" (available from WAKO Pure Chemical Co., Ltd.) and then the mixture was stirred in a nitrogen gas stream for 2 hours while reting the same at 65° C. To this reaction mixture, there was further dropwise added a mixture comprising 4.61 g of N-(p-aminosulfonylphenyl) methacrylamide, 2.94 g of ethyl methacrylate, 0.80 g of acrylonitrile, N,N-dimethyl acetamide and 0.15 g of "V-65" through the dropping funnel over 2 hours. After the dropwise addition of the mixture, the resulting mixture was additionally stirred at 65° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed and then drying the precipitates to give 15 g of a white solid. The weight-average molecular weight (polystyrene standard) of the specific copolymer was determined by the gel permeation chromatography and it was found to be 53,000.

The following coating solution of image-forming layer was applied onto the surface of the aluminum substrate obtained above in an amount of 1.8 g/m$_2$ (weighed after drying) to obtain a positive-working lithographic printing plate precursor.

| <Coating solution of Image-foaming Layer> | |
|---|---|
| The above specific copolymer 1 [Component (B)] | 0.4 g |
| M,p-cresol novolac [Component (B)] | 0.6 g |
| (m/p ratio = 6/4, weight-average molecular weight of 8,000, comprising 0.5% by weight of unreacted cresol) | |
| Cyanine dye A [Component (A + C)] | 0.1 g |
| Phthalic anhydride [Component (D)] | 0.05 g |
| P-toluene sulfonic acid | 0.002 g |
| Ethylviolet | 0.02 g |
| (counter ion: 6-hydroxy-β-naphthalene sulfonic acid) | |
| Esterified product of 1,2-diazonaphthoquinone-5-sulfonyl chloride and pyrogallol/acetone resin | 0.01 g |
| Fluorine atom-containing surfactant | 0.05 g |
| (trade name of MegafacF-177 manufacture by Dainippon Ink and Chemicals, Inc.) | |
| Methy ethyl ketone | 8 g |
| 1-Methoxy-2-propanol | 4 g |

Examples 1 to 16 and Comparative Example 1

SiO$_2$-containing alkaline liquid developers were prepared as follows. Diverse amphoteric surfactants were added in various amount summarized in the following Table 1 to one litter of aqueous solution comprising 5% by weight of potassium salt whose molar ratio of SiO$_2$/K$_2$O was 1.1, and 0.015% by weight of Olefin AK-02 (manufactured by Nisshin Chemicals, Inc) to obtain Developers (1) to (16) according to the present invention to be used in Examples 1 to 16.

Comparative developer (1) to be used in Comparative Example 1 was prepared according to the above procedure, provided that the amphoteric surfactant was not added.

Examples 17 to 45 and Comparative Example 2

SiO$_2$-containing alkaline liquid developers were prepared as follows. Diverse cationic surfactants were added in various amount summarized in the following Table 1 to one litter of aqueous solution comprising 4% by weight of potassium salt whose molar ratio of SiO$_2$/K$_2$O was 1.1 to obtain Developers (17) to (45) according to the present invention to be used in Examples 17 to 45.

Comparative developer (2) to be used in Comparative Example 2 was prepared according to the above procedure, provided that the cationic surfactant was not added Examples 46 to 61 and Comparative Example 3

Nonreducing sugar-containing alkaline liquid developers were prepared as follows. Diverse amphoteric surfactants were added in various amount summarized in the following Table 2 to one litter of aqueous solution comprising 5% by weight of potassium salt consisting of a combination of a nonreducing sugar and a base: D-sorbitol/pottasium oxide K$_2$O, and 0.015% by weight of Olefin AK-02 (manufactured by Nisshin Chemicals, Inc) to obtained Developers (46) to (61) according to the present invention to be used in Examples 46 to 61.

Comparative developer (3) to be used in Comparative Example 3 was prepared according to the above procedure, provided that the amphoteric surfactant was not added.

Examples 62 to 90 and Comparative Example 4

Nonreducing sugar-containing alkaline liquid developers were prepared as follows. Diverse cationic surfactants were added in various amount summarized in the following Table 2 to one litter of aqueous solution comprising 5% by weight of potassium salt consisting of a combination of a nonreducing sugar and a base: D-sorbitol/pottasium oxide K$_2$O to obtain Developers (62) to (90) according to the present invention to be used in Examples 62 to 90.

Comparative developer (4) to be used in Comparative Example 4 was prepared according to the above procedure, provided that the cationic surfactant was not added.

The surfactants used in the above Developers (1) to (90) were depicted below.

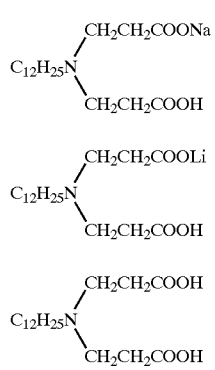
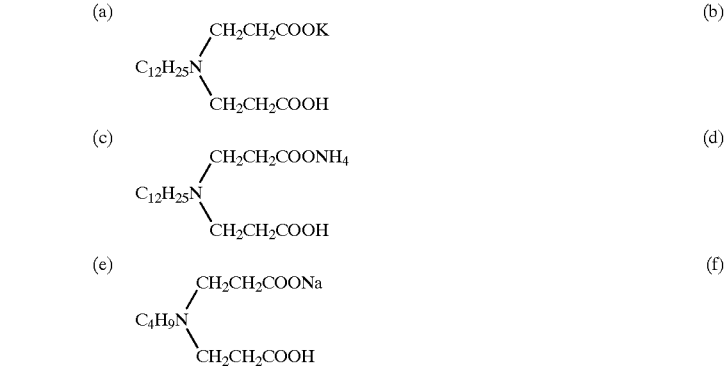

(g) C$_8$H$_{17}$N(CH$_2$CH$_2$COONa)(CH$_2$CH$_2$COOH)

(h) C$_{18}$H$_{35}$N(CH$_2$CH$_2$COONa)(CH$_2$CH$_2$COOH)

(i) C$_{18}$H$_{37}$N(CH$_2$CH$_2$COONa)(CH$_2$CH$_2$COOH)

(j) C$_{12}$H$_{25}$N(CH$_2$CH$_2$CH$_2$COONa)(CH$_2$CH$_2$CH$_2$COOH)

(k) C$_{12}$H$_{25}$—NH—CH$_2$CH$_2$COONa (l) C$_{18}$H$_{37}$—NH—CH$_2$CH$_2$COONa (m) C$_{12}$H$_{25}$—NH—CH$_2$CH$_2$CH$_2$COONa (n) [(C$_4$H$_9$)$_4$N$^+$] Br$^-$ (o) [(C$_4$H$_9$)$_4$N$^+$] Cl$^-$ (p) [(C$_4$H$_9$)$_4$N$^+$] OH$^-$ (q) [(C$_3$H$_7$)$_4$N$^+$] Br$^-$ (r) [(C$_3$H$_7$)$_4$N$^+$] Cl$^-$ (s) [(C$_3$H$_7$)$_4$N$^+$] OH$^-$ (t) [(C$_2$H$_5$)$_4$N$^+$] Br$^-$ (u) [(C$_2$H$_5$)$_4$N$^+$] Cl$^-$ (v) [(C$_2$H$_5$)$_4$N$^+$] OH$^-$ (w) [(CH$_3$)$_4$N$^+$] Br$^-$ (x) [(CH$_3$)$_4$N$^+$] Cl$^-$ (y) [(CH$_3$)$_4$N$^+$] OH$^-$ (z) [C$_6$H$_5$CH$_2$—S$^+$(C$_{12}$H$_{25}$)(CH$_3$)] O$^-$—SO$_2$—OCH$_3$ (aa) [C$_{12}$H$_{25}$—P$^+$(C$_6$H$_5$)$_3$] Br$^-$ (bb) [C$_{12}$H$_{25}$-isoquinolinium]$^+$ Cl$^-$ (cc) [C$_{16}$H$_{33}$—O—H$_2$C—pyridinium$^+$] Cl$^-$ (dd) [C$_{18}$H$_{35}$—CO—NH—H$_2$C—pyridinium$^+$] Cl$^-$ -continued
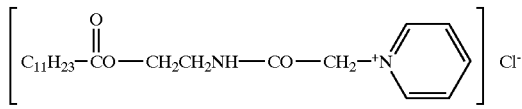 (ee)   (ff)
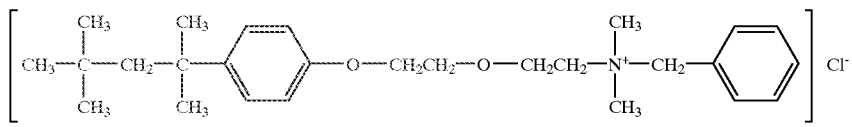 (gg)
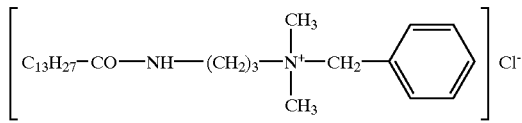 (hh)  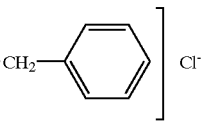 (ii)
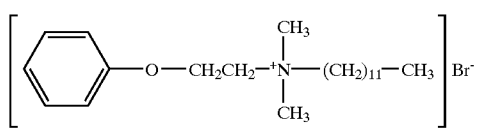 (jj)  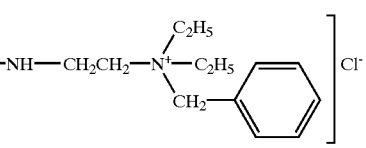 (kk)
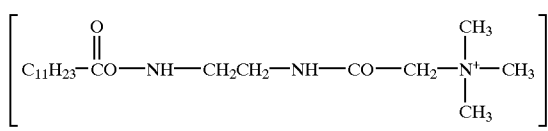 (ll)   (mm)
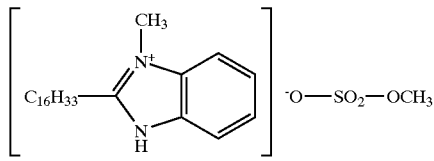 (nn)
TABLE 1
SiO$_2$-containing Developers (1) to (45)
| Developer No. | Surfactant | Concentration of the Surfactant (g/little) |
|---|---|---|
| (1) | (a) | 0.01 |
| (2) | (a) | 1.0 |
| (3) | (a) | 10.0 |
| (4) | (a) | 100.0 |
| (5) | (b) | 1.0 |
| (6) | (c) | 1.0 |
| (7) | (d) | 1.0 |
| (8) | (e) | 1.0 |
| (9) | (f) | 1.0 |
| (10) | (g) | 1.0 |
| (11) | (h) | 1.0 |
| (12) | (i) | 1.0 |
| (13) | (j) | 1.0 |
| (14) | (k) | 1.0 |
| (15) | (l) | 1.0 |
| (16) | (m) | 1.0 |
| (17) | (n) | 1.0 |
| (18) | (o) | 1.0 |
| (19) | (p) | 1.0 |
| (20) | (q) | 0.01 |
| (21) | (q) | 1.0 |
| (22) | (q) | 100.0 |
| (23) | (r) | 1.0 |
| (24) | (s) | 1.0 |
| (25) | (t) | 1.0 |
| (26) | (u) | 1.0 |
| (27) | (v) | 1.0 |
| (28) | (w) | 1.0 |
| (29) | (x) | 1.0 |
| (30) | (y) | 1.0 |
| (31) | (z) | 1.0 |
| (32) | (aa) | 1.0 |
| (33) | (bb) | 1.0 |
| (34) | (cc) | 1.0 |
| (35) | (dd) | 1.0 |
| (36) | (ee) | 1.0 |
| (37) | (ff) | 1.0 |
| (38) | (gg) | 1.0 |
| (39) | (hh) | 1.0 |
| (40) | (ii) | 1.0 |
| (41) | (jj) | 1.0 |
| (42) | (kk) | 1.0 |
| (43) | (ll) | 1.0 |
| (44) | (mm) | 1.0 |
| (45) | (nn) | 1.0 |

TABLE 2

Nonreducing sugar-containing Developers (46) to (90)

| Developer No. | Surfactant | Concentration of the Surfactant (g/little) |
|---|---|---|
| (46) | (a) | 0.01 |
| (47) | (a) | 1.0 |
| (48) | (a) | 10.0 |
| (49) | (a) | 100.0 |
| (50) | (b) | 1.0 |
| (51) | (c) | 1.0 |
| (52) | (d) | 1.0 |
| (53) | (e) | 1.0 |
| (54) | (f) | 1.0 |
| (55) | (g) | 1.0 |
| (56) | (h) | 1.0 |
| (57) | (i) | 1.0 |
| (58) | (j) | 1.0 |
| (59) | (k) | 1.0 |
| (60) | (l) | 1.0 |
| (61) | (m) | 1.0 |
| (62) | (n) | 1.0 |
| (63) | (o) | 1.0 |
| (64) | (p) | 1.0 |
| (65) | (q) | 0.01 |
| (66) | (q) | 1.0 |
| (67) | (q) | 100.0 |
| (68) | (r) | 1.0 |
| (69) | (s) | 1.0 |
| (70) | (t) | 1.0 |
| (71) | (u) | 1.0 |
| (72) | (v) | 1.0 |
| (73) | (w) | 1.0 |
| (74) | (x) | 1.0 |
| (75) | (y) | 1.0 |
| (76) | (z) | 1.0 |
| (77) | (aa) | 1.0 |
| (78) | (bb) | 1.0 |
| (79) | (cc) | 1.0 |
| (80) | (dd) | 1.0 |
| (81) | (ee) | 1.0 |
| (82) | (ff) | 1.0 |
| (83) | (gg) | 1.0 |
| (84) | (hh) | 1.0 |
| (85) | (ii) | 1.0 |
| (86) | (jj) | 1.0 |
| (87) | (kk) | 1.0 |
| (88) | (ll) | 1.0 |
| (89) | (mm) | 1.0 |
| (90) | (nn) | 1.0 |

The above obtained lithographic printing plate precursor was light-exposed using a semiconductor laser with an output power of 500 mW, a wave length of 830 nm and a beam diameter of 17 $\mu$m($1/e^2$) at a horizontal scanning speed of 5 m/sec, and maintained at 25° C.

The lithographic printing plate precursor thus treated was processed by an automatic processor, PS900NP (manufactured by Fuji Photo Film Co., Ltd.) filled up with the above each developer, at a development temperature of 25° C., 28° C., 30° C. or 35° C. for 12 seconds. After the development procedure, the plate was washed with water and treated with a gum solution (two-fold dilution of GU-7 manufactured by Fuji Photo Film Co., Ltd.) so as to obtain a lithographic printing plate.

<Evaluation on Balance of Image Area/Non-image Area>

[Evaluation on Development of Non-image Area]

Development of the non-image areas of the above lithographic printing plate obtained by processing at the given temperature was visually determined by observing undissolved, left materials on non-image areas. In addition, toning on a printed matter was also evaluated.

Criteria:
- ○: The non-image areas were sufficiently developed and there was observed no undissolved, left materials on the non-image areas. Toning on the printed matter was not observed.
- Δ: The image-forming layer was left slightly on the non-image areas. Toning on the printed matter was not observed.
- ×: Failure of development was observed, and the image-forming layer was left on the non-image areas. Toning on the printed matter was observed.

[Evaluation of Impairment of Image Area]

Impairment of the image areas of the above lithographic printing plate obtained by processing at the given temperature was visually determined.

Criteria:
- ○: There was observed no impairment in the image areas. Color defect of the image areas on the printed matter was not observed.
- Δ: Image density was slightly decreased, and the impairment of the image areas was partially observed. Color defect of the image areas on the printed matter was not observed.
- ×: Image density was largely decreased, and the impairment of the image areas was partially observed. Color defect of the image areas on the printed matter was observed.

The results of the above evaluation are summarized in Tables 3 to 6.

<Insoluble Matter in Developer>

The developer which had been used in the processing of 1 $m^2$, 10 $m^2$ or 100 $m^2$ plate per one litter was left in a refrigerator at 5° C., at room temperature at from 20 to 25° C., or in a thermostatic chamber at 35° C. for one month, and then the insoluble matter in the developer was observed.

Criteria:
- ○: There was no insoluble matter.
- Δ: There was slightly insoluble matter, but the insoluble matter was dissolved and eliminated by shaking.
- ×: There was insoluble matter, even if the developer was shaken.

The results obtained are summarized in Tables 7 to 10.

TABLE 3

| | | Development temperature | | | | | |
|---|---|---|---|---|---|---|---|
| | | Development of Non-Image Area | | | Impairment of Image Area | | |
| Example No. | Developer No. | 25° C. | 28° C. | 30° C. | 25° C. | 28° C. | 30° C. |
| 1 | (1) | ○ | ○ | ○ | ○ | ○ | ○ |
| 2 | (2) | ○ | ○ | ○ | ○ | ○ | ○ |
| 3 | (3) | ○ | ○ | ○ | ○ | ○ | ○ |
| 4 | (4) | ○ | ○ | ○ | ○ | ○ | ○ |
| 5 | (5) | ○ | ○ | ○ | ○ | ○ | ○ |
| 6 | (6) | ○ | ○ | ○ | ○ | ○ | ○ |
| 7 | (7) | ○ | ○ | ○ | ○ | ○ | ○ |
| 8 | (8) | ○ | ○ | ○ | ○ | ○ | ○ |
| 9 | (9) | ○ | ○ | ○ | ○ | ○ | ○ |
| 10 | (10) | ○ | ○ | ○ | ○ | ○ | ○ |
| 11 | (11) | ○ | ○ | ○ | ○ | ○ | ○ |
| 12 | (12) | ○ | ○ | ○ | ○ | ○ | ○ |
| 13 | (13) | ○ | ○ | ○ | ○ | ○ | ○ |
| 14 | (14) | ○ | ○ | ○ | ○ | ○ | ○ |

TABLE 3-continued

| Example No. | Developer No. | Development temperature | | | | | |
|---|---|---|---|---|---|---|---|
| | | Development of Non-Image Area | | | Impairment of Image Area | | |
| | | 25° C. | 28° C. | 30° C. | 25° C. | 28° C. | 30° C. |
| 15 | (15) | ○ | ○ | ○ | ○ | ○ | ○ |
| 16 | (16) | ○ | ○ | ○ | ○ | ○ | ○ |
| Comparative Example 1 | Comparative developer (1) | X | Δ | ○ | ○ | Δ | X |

TABLE 4

| Example No. | Developer No. | Development temperature | | | | | |
|---|---|---|---|---|---|---|---|
| | | Development of Non-Image Area | | | Impairment of Image Area | | |
| | | 25° C. | 30° C. | 35° C. | 25° C. | 30° C. | 35° C. |
| 17 | (17) | ○ | ○ | ○ | ○ | ○ | ○ |
| 18 | (18) | ○ | ○ | ○ | ○ | ○ | ○ |
| 19 | (19) | ○ | ○ | ○ | ○ | ○ | ○ |
| 20 | (20) | ○ | ○ | ○ | ○ | ○ | ○ |
| 21 | (21) | ○ | ○ | ○ | ○ | ○ | ○ |
| 22 | (22) | ○ | ○ | ○ | ○ | ○ | ○ |
| 23 | (23) | ○ | ○ | ○ | ○ | ○ | ○ |
| 24 | (24) | ○ | ○ | ○ | ○ | ○ | ○ |
| 25 | (25) | ○ | ○ | ○ | ○ | ○ | ○ |
| 26 | (26) | ○ | ○ | ○ | ○ | ○ | ○ |
| 27 | (27) | ○ | ○ | ○ | ○ | ○ | ○ |
| 28 | (28) | ○ | ○ | ○ | ○ | ○ | ○ |
| 29 | (29) | ○ | ○ | ○ | ○ | ○ | ○ |
| 30 | (30) | ○ | ○ | ○ | ○ | ○ | ○ |
| 31 | (31) | ○ | ○ | ○ | ○ | ○ | ○ |
| 32 | (32) | ○ | ○ | ○ | ○ | ○ | ○ |
| 33 | (33) | ○ | ○ | ○ | ○ | ○ | ○ |
| 34 | (34) | ○ | ○ | ○ | ○ | ○ | ○ |
| 35 | (35) | ○ | ○ | ○ | ○ | ○ | ○ |
| 36 | (36) | ○ | ○ | ○ | ○ | ○ | ○ |
| 37 | (37) | ○ | ○ | ○ | ○ | ○ | ○ |
| 38 | (38) | ○ | ○ | ○ | ○ | ○ | ○ |
| 39 | (39) | ○ | ○ | ○ | ○ | ○ | ○ |
| 40 | (40) | ○ | ○ | ○ | ○ | ○ | ○ |
| 41 | (41) | ○ | ○ | ○ | ○ | ○ | ○ |
| 42 | (42) | ○ | ○ | ○ | ○ | ○ | ○ |
| 43 | (43) | ○ | ○ | ○ | ○ | ○ | ○ |
| 44 | (44) | ○ | ○ | ○ | ○ | ○ | ○ |
| 45 | (45) | ○ | ○ | ○ | ○ | ○ | ○ |
| Comparative Example 2 | Comparative developer (2) | X | Δ | ○ | ○ | X | X |

TABLE 5

| Example No. | Developer No. | Development temperature | | | | | |
|---|---|---|---|---|---|---|---|
| | | Development of Non-Image Area | | | Impairment of Image Area | | |
| | | 25° C. | 28° C. | 30° C. | 25° C. | 28° C. | 30° C. |
| 46 | (46) | ○ | ○ | ○ | ○ | ○ | ○ |
| 47 | (47) | ○ | ○ | ○ | ○ | ○ | ○ |
| 48 | (48) | ○ | ○ | ○ | ○ | ○ | ○ |
| 49 | (49) | ○ | ○ | ○ | ○ | ○ | ○ |
| 50 | (50) | ○ | ○ | ○ | ○ | ○ | ○ |
| 51 | (51) | ○ | ○ | ○ | ○ | ○ | ○ |
| 52 | (52) | ○ | ○ | ○ | ○ | ○ | ○ |
| 53 | (53) | ○ | ○ | ○ | ○ | ○ | ○ |
| 54 | (54) | ○ | ○ | ○ | ○ | ○ | ○ |
| 55 | (55) | ○ | ○ | ○ | ○ | ○ | ○ |
| 56 | (56) | ○ | ○ | ○ | ○ | ○ | ○ |
| 57 | (57) | ○ | ○ | ○ | ○ | ○ | ○ |
| 58 | (58) | ○ | ○ | ○ | ○ | ○ | ○ |
| 59 | (59) | ○ | ○ | ○ | ○ | ○ | ○ |
| 60 | (60) | ○ | ○ | ○ | ○ | ○ | ○ |
| 61 | (61) | ○ | ○ | ○ | ○ | ○ | ○ |
| Comparative Example 3 | Comparative developer (3) | X | Δ | ○ | ○ | Δ | X |

TABLE 6

| Example No. | Developer No. | Development temperature | | | | | |
|---|---|---|---|---|---|---|---|
| | | Development of Non-Image Area | | | Impairment of Image Area | | |
| | | 25° C. | 30° C. | 35° C. | 25° C. | 30° C. | 35° C. |
| 62 | (62) | ○ | ○ | ○ | ○ | ○ | ○ |
| 63 | (63) | ○ | ○ | ○ | ○ | ○ | ○ |
| 64 | (64) | ○ | ○ | ○ | ○ | ○ | ○ |
| 65 | (65) | ○ | ○ | ○ | ○ | ○ | ○ |
| 66 | (66) | ○ | ○ | ○ | ○ | ○ | ○ |
| 67 | (67) | ○ | ○ | ○ | ○ | ○ | ○ |
| 68 | (68) | ○ | ○ | ○ | ○ | ○ | ○ |
| 69 | (69) | ○ | ○ | ○ | ○ | ○ | ○ |
| 70 | (70) | ○ | ○ | ○ | ○ | ○ | ○ |
| 71 | (71) | ○ | ○ | ○ | ○ | ○ | ○ |
| 72 | (72) | ○ | ○ | ○ | ○ | ○ | ○ |
| 73 | (73) | ○ | ○ | ○ | ○ | ○ | ○ |
| 74 | (74) | ○ | ○ | ○ | ○ | ○ | ○ |
| 75 | (75) | ○ | ○ | ○ | ○ | ○ | ○ |
| 76 | (76) | ○ | ○ | ○ | ○ | ○ | ○ |
| 77 | (77) | ○ | ○ | ○ | ○ | ○ | ○ |
| 78 | (78) | ○ | ○ | ○ | ○ | ○ | ○ |
| 79 | (79) | ○ | ○ | ○ | ○ | ○ | ○ |
| 80 | (80) | ○ | ○ | ○ | ○ | ○ | ○ |
| 81 | (81) | ○ | ○ | ○ | ○ | ○ | ○ |
| 82 | (82) | ○ | ○ | ○ | ○ | ○ | ○ |
| 83 | (83) | ○ | ○ | ○ | ○ | ○ | ○ |
| 84 | (84) | ○ | ○ | ○ | ○ | ○ | ○ |
| 85 | (85) | ○ | ○ | ○ | ○ | ○ | ○ |
| 86 | (86) | ○ | ○ | ○ | ○ | ○ | ○ |
| 87 | (87) | ○ | ○ | ○ | ○ | ○ | ○ |
| 88 | (88) | ○ | ○ | ○ | ○ | ○ | ○ |
| 89 | (89) | ○ | ○ | ○ | ○ | ○ | ○ |
| 90 | (90) | ○ | ○ | ○ | ○ | ○ | ○ |
| Comparative Example 4 | Comparative developer (4) | X | Δ | ○ | ○ | X | X |

TABLE 7

Insoluble Matter in Developer

| Example No. | Developer No. | Storage Temperature 5° C. Throughput (plate m²/litter) | | | 20~25° C. | | | 35° C. | | |
|---|---|---|---|---|---|---|---|---|---|---|
| | | 1 | 10 | 100 | 1 | 10 | 100 | 1 | 10 | 100 |
| 1 | (1) | ○ | ○ | ○ | ○ | ○ | ○ | ○ | ○ | ○ |
| 2 | (2) | ○ | ○ | ○ | ○ | ○ | ○ | ○ | ○ | ○ |
| 3 | (3) | ○ | ○ | ○ | ○ | ○ | ○ | ○ | ○ | ○ |
| 4 | (4) | ○ | ○ | ○ | ○ | ○ | ○ | ○ | ○ | ○ |
| 5 | (5) | ○ | ○ | ○ | ○ | ○ | ○ | ○ | ○ | ○ |
| 6 | (6) | ○ | ○ | ○ | ○ | ○ | ○ | ○ | ○ | ○ |
| 7 | (7) | ○ | ○ | ○ | ○ | ○ | ○ | ○ | ○ | ○ |
| 8 | (8) | ○ | ○ | ○ | ○ | ○ | ○ | ○ | ○ | ○ |
| 9 | (9) | ○ | ○ | ○ | ○ | ○ | ○ | ○ | ○ | ○ |
| 10 | (10) | ○ | ○ | ○ | ○ | ○ | ○ | ○ | ○ | ○ |
| 11 | (11) | ○ | ○ | ○ | ○ | ○ | ○ | ○ | ○ | ○ |
| 12 | (12) | ○ | ○ | ○ | ○ | ○ | ○ | ○ | ○ | ○ |
| 13 | (13) | ○ | ○ | ○ | ○ | ○ | ○ | ○ | ○ | ○ |
| 14 | (14) | ○ | ○ | ○ | ○ | ○ | ○ | ○ | ○ | ○ |
| 15 | (15) | ○ | ○ | ○ | ○ | ○ | ○ | ○ | ○ | ○ |
| 16 | (16) | ○ | ○ | ○ | ○ | ○ | ○ | ○ | ○ | ○ |
| Comparative Example 1 | Comparative developer (1) | X | X | X | Δ | X | X | ○ | Δ | X |

TABLE 8

Insoluble Matter in Developer

| Example No. | Developer No. | Storage Temperature 5° C. Throughput (plate m²/litter) | | | 20~25° C. | | | 35° C. | | |
|---|---|---|---|---|---|---|---|---|---|---|
| | | 1 | 10 | 100 | 1 | 10 | 100 | 1 | 10 | 100 |
| 17 | (17) | ○ | ○ | ○ | ○ | ○ | ○ | ○ | ○ | ○ |
| 18 | (18) | ○ | ○ | ○ | ○ | ○ | ○ | ○ | ○ | ○ |
| 19 | (19) | ○ | ○ | ○ | ○ | ○ | ○ | ○ | ○ | ○ |
| 20 | (20) | ○ | ○ | ○ | ○ | ○ | ○ | ○ | ○ | ○ |
| 21 | (21) | ○ | ○ | ○ | ○ | ○ | ○ | ○ | ○ | ○ |
| 22 | (22) | ○ | ○ | ○ | ○ | ○ | ○ | ○ | ○ | ○ |
| 23 | (23) | ○ | ○ | ○ | ○ | ○ | ○ | ○ | ○ | ○ |
| 24 | (24) | ○ | ○ | ○ | ○ | ○ | ○ | ○ | ○ | ○ |
| 25 | (25) | ○ | ○ | ○ | ○ | ○ | ○ | ○ | ○ | ○ |
| 26 | (26) | ○ | ○ | ○ | ○ | ○ | ○ | ○ | ○ | ○ |
| 27 | (27) | ○ | ○ | ○ | ○ | ○ | ○ | ○ | ○ | ○ |
| 28 | (28) | ○ | ○ | ○ | ○ | ○ | ○ | ○ | ○ | ○ |
| 29 | (29) | ○ | ○ | ○ | ○ | ○ | ○ | ○ | ○ | ○ |
| 30 | (30) | ○ | ○ | ○ | ○ | ○ | ○ | ○ | ○ | ○ |
| 31 | (31) | ○ | ○ | ○ | ○ | ○ | ○ | ○ | ○ | ○ |
| 32 | (32) | ○ | ○ | ○ | ○ | ○ | ○ | ○ | ○ | ○ |
| 33 | (33) | ○ | ○ | ○ | ○ | ○ | ○ | ○ | ○ | ○ |
| 34 | (34) | ○ | ○ | ○ | ○ | ○ | ○ | ○ | ○ | ○ |
| 35 | (35) | ○ | ○ | ○ | ○ | ○ | ○ | ○ | ○ | ○ |
| 36 | (36) | ○ | ○ | ○ | ○ | ○ | ○ | ○ | ○ | ○ |
| 37 | (37) | ○ | ○ | ○ | ○ | ○ | ○ | ○ | ○ | ○ |
| 38 | (38) | ○ | ○ | ○ | ○ | ○ | ○ | ○ | ○ | ○ |
| 39 | (39) | ○ | ○ | ○ | ○ | ○ | ○ | ○ | ○ | ○ |
| 40 | (40) | ○ | ○ | ○ | ○ | ○ | ○ | ○ | ○ | ○ |
| 41 | (41) | ○ | ○ | ○ | ○ | ○ | ○ | ○ | ○ | ○ |
| 42 | (42) | ○ | ○ | ○ | ○ | ○ | ○ | ○ | ○ | ○ |
| 43 | (43) | ○ | ○ | ○ | ○ | ○ | ○ | ○ | ○ | ○ |
| 44 | (44) | ○ | ○ | ○ | ○ | ○ | ○ | ○ | ○ | ○ |
| 45 | (45) | ○ | ○ | ○ | ○ | ○ | ○ | ○ | ○ | ○ |
| Comparative Example 2 | Comparative developer (2) | X | X | X | Δ | X | X | ○ | Δ | X |

TABLE 9

Insoluble Matter in Developer

| Example No. | Developer No. | Storage Temperature 5° C. Throughput (plate m²/litter) | | | 20~25° C. | | | 35° C. | | |
|---|---|---|---|---|---|---|---|---|---|---|
| | | 1 | 10 | 100 | 1 | 10 | 100 | 1 | 10 | 100 |
| 46 | (46) | ○ | ○ | ○ | ○ | ○ | ○ | ○ | ○ | ○ |
| 47 | (47) | ○ | ○ | ○ | ○ | ○ | ○ | ○ | ○ | ○ |
| 48 | (48) | ○ | ○ | ○ | ○ | ○ | ○ | ○ | ○ | ○ |
| 49 | (49) | ○ | ○ | ○ | ○ | ○ | ○ | ○ | ○ | ○ |
| 50 | (50) | ○ | ○ | ○ | ○ | ○ | ○ | ○ | ○ | ○ |
| 51 | (51) | ○ | ○ | ○ | ○ | ○ | ○ | ○ | ○ | ○ |
| 52 | (52) | ○ | ○ | ○ | ○ | ○ | ○ | ○ | ○ | ○ |
| 53 | (53) | ○ | ○ | ○ | ○ | ○ | ○ | ○ | ○ | ○ |
| 54 | (54) | ○ | ○ | ○ | ○ | ○ | ○ | ○ | ○ | ○ |
| 55 | (55) | ○ | ○ | ○ | ○ | ○ | ○ | ○ | ○ | ○ |
| 56 | (56) | ○ | ○ | ○ | ○ | ○ | ○ | ○ | ○ | ○ |
| 57 | (57) | ○ | ○ | ○ | ○ | ○ | ○ | ○ | ○ | ○ |
| 58 | (58) | ○ | ○ | ○ | ○ | ○ | ○ | ○ | ○ | ○ |
| 59 | (59) | ○ | ○ | ○ | ○ | ○ | ○ | ○ | ○ | ○ |
| 60 | (60) | ○ | ○ | ○ | ○ | ○ | ○ | ○ | ○ | ○ |
| 61 | (61) | ○ | ○ | ○ | ○ | ○ | ○ | ○ | ○ | ○ |
| Comparative Example 3 | Comparative developer (3) | X | X | X | Δ | X | X | ○ | Δ | X |

TABLE 10

Insoluble Matter in Developer

| Example No. | Developer No. | Storage Temperature 5° C. Throughput (plate m²/litter) | | | 20~25° C. | | | 35° C. | | |
|---|---|---|---|---|---|---|---|---|---|---|
| | | 1 | 10 | 100 | 1 | 10 | 100 | 1 | 10 | 100 |
| 62 | (62) | ○ | ○ | ○ | ○ | ○ | ○ | ○ | ○ | ○ |
| 63 | (63) | ○ | ○ | ○ | ○ | ○ | ○ | ○ | ○ | ○ |
| 64 | (64) | ○ | ○ | ○ | ○ | ○ | ○ | ○ | ○ | ○ |
| 65 | (65) | ○ | ○ | ○ | ○ | ○ | ○ | ○ | ○ | ○ |
| 66 | (66) | ○ | ○ | ○ | ○ | ○ | ○ | ○ | ○ | ○ |
| 67 | (67) | ○ | ○ | ○ | ○ | ○ | ○ | ○ | ○ | ○ |
| 68 | (68) | ○ | ○ | ○ | ○ | ○ | ○ | ○ | ○ | ○ |
| 69 | (69) | ○ | ○ | ○ | ○ | ○ | ○ | ○ | ○ | ○ |
| 70 | (70) | ○ | ○ | ○ | ○ | ○ | ○ | ○ | ○ | ○ |
| 71 | (71) | ○ | ○ | ○ | ○ | ○ | ○ | ○ | ○ | ○ |
| 72 | (72) | ○ | ○ | ○ | ○ | ○ | ○ | ○ | ○ | ○ |
| 73 | (73) | ○ | ○ | ○ | ○ | ○ | ○ | ○ | ○ | ○ |
| 74 | (74) | ○ | ○ | ○ | ○ | ○ | ○ | ○ | ○ | ○ |
| 75 | (75) | ○ | ○ | ○ | ○ | ○ | ○ | ○ | ○ | ○ |

TABLE 10-continued

Insoluble Matter in Developer

| Example No. | Developer No. | Storage Temperature 5° C. Throughput (plate m²/litter) | | | 20~25° C. | | | 35° C. | | |
|---|---|---|---|---|---|---|---|---|---|---|
| | | 1 | 10 | 100 | 1 | 10 | 100 | 1 | 10 | 100 |
| 76 | (76) | ○ | ○ | ○ | ○ | ○ | ○ | ○ | ○ | ○ |
| 77 | (77) | ○ | ○ | ○ | ○ | ○ | ○ | ○ | ○ | ○ |
| 78 | (78) | ○ | ○ | ○ | ○ | ○ | ○ | ○ | ○ | ○ |
| 79 | (79) | ○ | ○ | ○ | ○ | ○ | ○ | ○ | ○ | ○ |
| 80 | (80) | ○ | ○ | ○ | ○ | ○ | ○ | ○ | ○ | ○ |
| 81 | (81) | ○ | ○ | ○ | ○ | ○ | ○ | ○ | ○ | ○ |
| 82 | (82) | ○ | ○ | ○ | ○ | ○ | ○ | ○ | ○ | ○ |
| 83 | (83) | ○ | ○ | ○ | ○ | ○ | ○ | ○ | ○ | ○ |
| 84 | (84) | ○ | ○ | ○ | ○ | ○ | ○ | ○ | ○ | ○ |
| 85 | (85) | ○ | ○ | ○ | ○ | ○ | ○ | ○ | ○ | ○ |
| 86 | (86) | ○ | ○ | ○ | ○ | ○ | ○ | ○ | ○ | ○ |
| 87 | (87) | ○ | ○ | ○ | ○ | ○ | ○ | ○ | ○ | ○ |
| 88 | (88) | ○ | ○ | ○ | ○ | ○ | ○ | ○ | ○ | ○ |
| 89 | (89) | ○ | ○ | ○ | ○ | ○ | ○ | ○ | ○ | ○ |
| 90 | (90) | ○ | ○ | ○ | ○ | ○ | ○ | ○ | ○ | ○ |
| Comparative Example 4 | Comparative developer (4) | X | X | X | Δ | X | X | ○ | Δ | X |

Effect of the Invention

The alkaline liquid developer of the present invention makes it possible to form a highly sharp and clear image in a lithographic printing plate without damages to the image areas, simultaneously exhibiting highly development performance to the non-image areas. The alkaline liquid developer of the present invention further inhibits occurrence of insoluble matter originated from a binder resin and/or an IR-absorbing agent, as well as adherence of the insoluble matter to the surface of a plate during processing, while retaining liquid conditions suitable for an alkaline liquid developer, and being capable of providing a stable processing procedure in an extended period.

What is claimed is:

1. A method for preparing a lithographic printing plate comprising the steps of imagewise light-exposing to infrared radiation, a presensitized plate for use in making a lithographic printing plate, said presensitized plate having an image-forming layer which comprises an IR-absorbing agent, and developing the light-exposed plate with an alkaline liquid developer comprising at least one selected from the group consisting of amphoteric surfactant and cationic surfactant.

2. The method of claim 1, wherein the amphoteric surfactant is selected from the group consisting of the compounds represented by the following formula (I) or (II), and a salt thereof:

$$R^1-NH-(CH_2)_m COOH \quad (I)$$

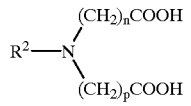

(II)

wherein $R^1$ and $R^2$ independently represent a hydrocarbon group having carbon atoms of 4 to 30, and m, n and p independently represent an integer of from 1 to 10.

3. The method of claim 1 wherein the cationic surfactant is selected from the group consisting of amine salts, quaternary ammonium salts, phosphonium salts and sulfonium salts.

* * * * *